United States Patent [19]

Belmondo et al.

[11] Patent Number: 4,571,724
[45] Date of Patent: Feb. 18, 1986

[54] SYSTEM FOR TESTING DIGITAL LOGIC DEVICES

[75] Inventors: Victor E. Belmondo, King County, Wash.; Russell M. dePina, Santa Clara County, Calif.; George W. James, King County, Wash.; Robert G. Martin, Snohomish County, Wash.; John M. Reece, King County, Wash.

[73] Assignee: Data I/O Corporation, Redmond, Wash.

[21] Appl. No.: 478,412

[22] Filed: Mar. 23, 1983

[51] Int. Cl.⁴ .................... G01R 31/28; G06F 11/00
[52] U.S. Cl. .................... 371/25; 324/73 R; 371/27
[58] Field of Search ............ 371/20, 25, 27; 324/73 R, 73 AT

[56] References Cited

U.S. PATENT DOCUMENTS

| | | | |
|---|---|---|---|
| 3,582,633 | 6/1971 | Webb | 371/25 |
| 3,657,527 | 4/1972 | Kassabgi et al. | 371/25 |
| 3,739,160 | 6/1973 | El-Hasan et al. | 371/25 |
| 3,924,181 | 12/1975 | Alderson | 324/73 R |
| 4,108,359 | 8/1978 | Proto | 371/25 |

*Primary Examiner*—Charles E. Atkinson
*Attorney, Agent, or Firm*—Seed and Berry

[57] ABSTRACT

A functional testing system for programmable logic devices. Test vectors are generated by a shift register and applied to the contact pins of the logic device through isolation elements so that all pins may be treated alike regardless of whether they are inputs or outputs. The logic level on pins that are outputs are controlled by the logic device, while logic levels on pins that are inputs are controlled by the shift register. The response of the logic device to the test vector is recorded in an output shift register and the response is then shifted out of the shift register to one input of an exclusive OR gate that also receives outputs from predetermined stages of the test vector shift register to create a pseudo-random function. The output of the exclusive OR gate is shifted into the test vector shift register as each bit of the logic device's response is applied to the exclusive OR gate thereby creating a new test vector. The number of test vectors applied to the logic device is counted and when a predetermined number is reached, the test terminates and the current test vector is then stored and compared to the final test vector obtained by performing the same test on an identical circuit known to be operating correctly. The testing system thus evaluates the functionality of the logic device while also providing the stimulus to the device.

15 Claims 17 Drawing Figures

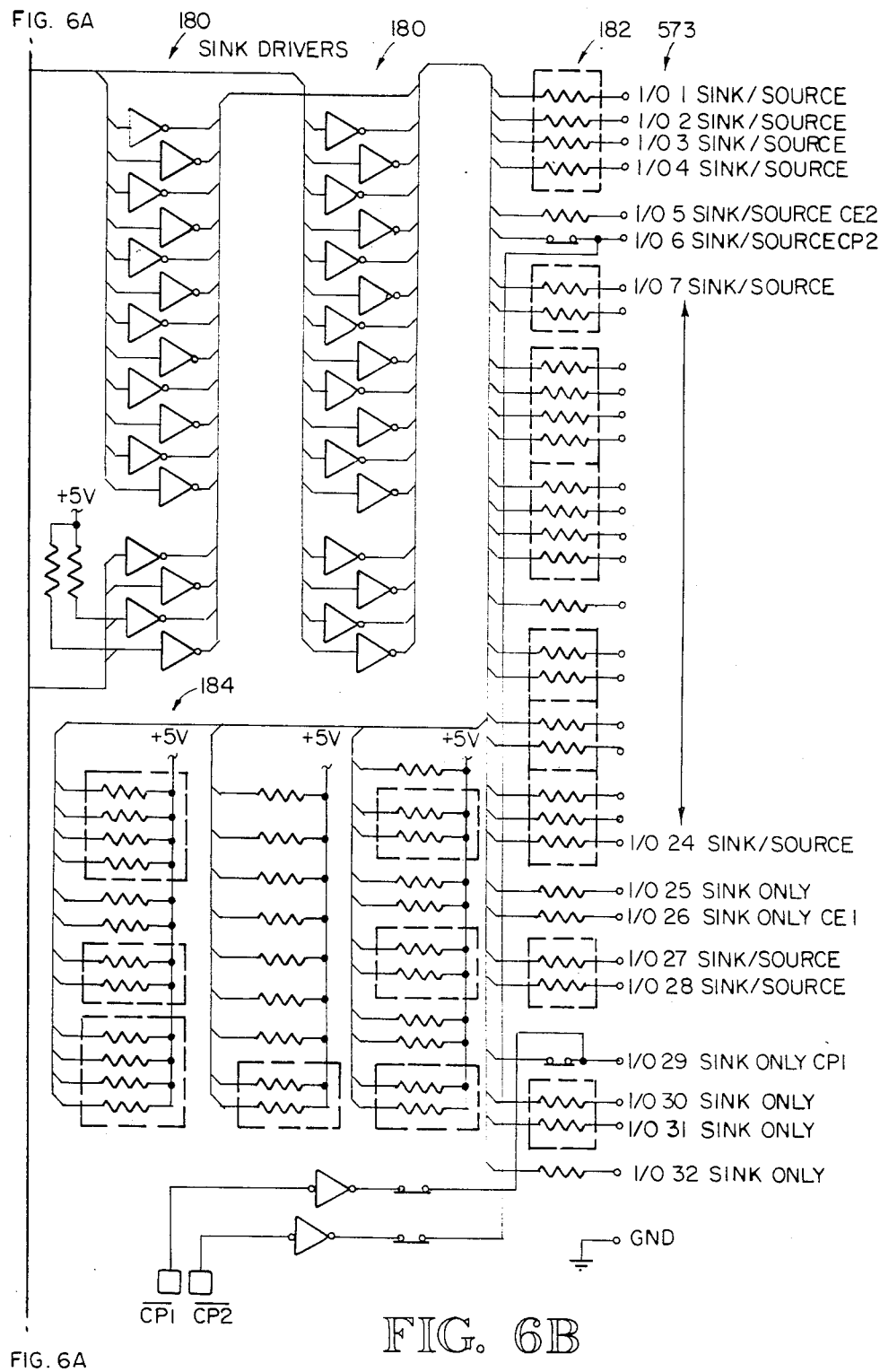

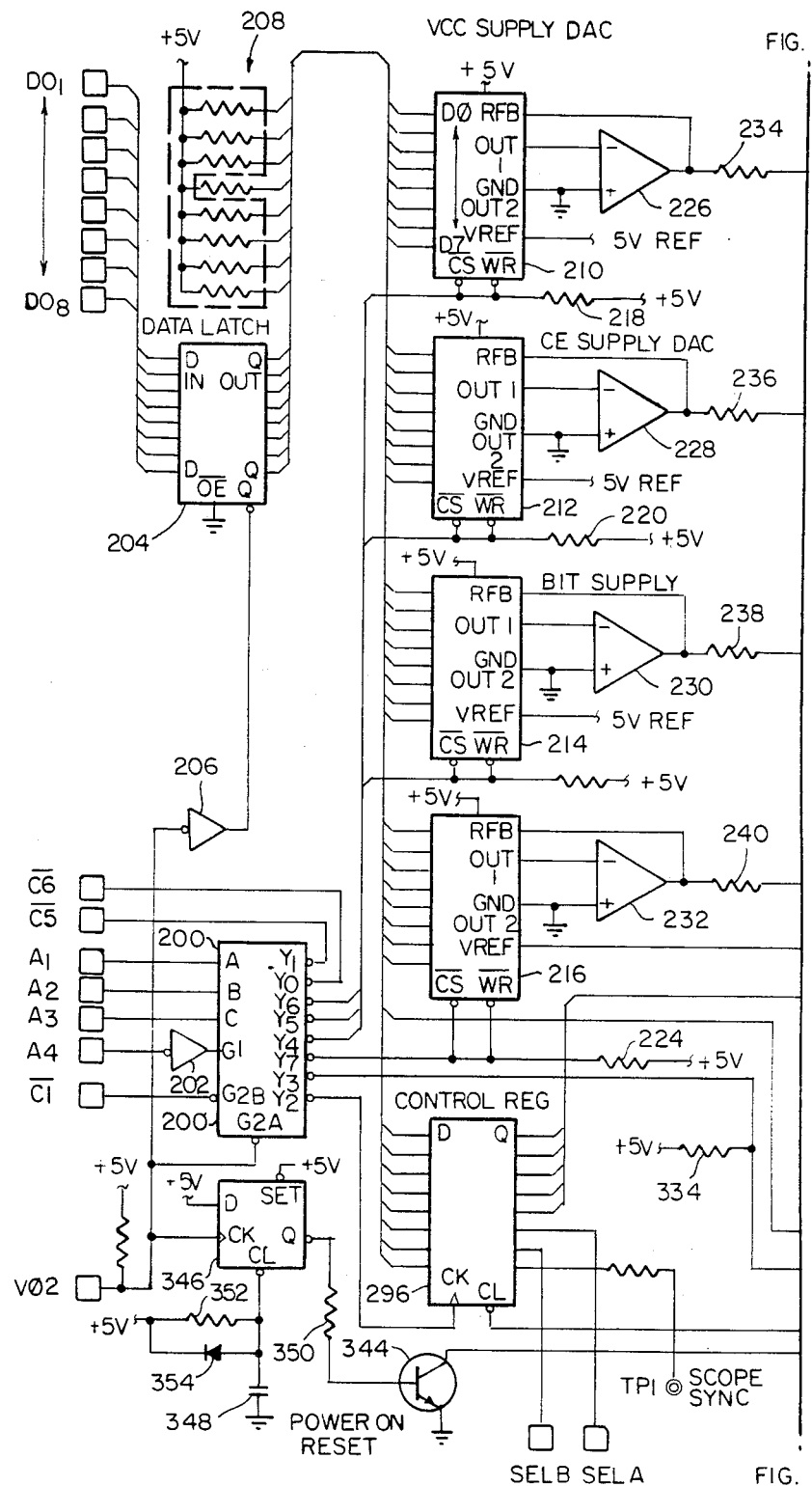

SYSTEM FOR TESTING DIGITAL LOGIC DEVICES

DESCRIPTION

1. Technical Field

This invention relates to electronic test equipment, and more particularly to a system for automatically performing functional tests on digital logic devices.

2. Background Art

Programmable logic devices consist of arrays of logic elements that may be programmed by the user by selectively blowing fuses to implement complex logic functions. Programmable logic arrays are programmed in a manner similar to that of programmable read-only memories (PROMS), and they may be programmed with similar equipment. Despite the similarities, logic devices require different programming support functions than PROMs. When a PROM is programmed, the data that is stored in the PROM is usually a high-level program which either has been compiled into machine code or is an assembly language program that has been assembled into machine code. The binary information is then stored in read-only memory (ROM) for editing, and when the data is correct, the PROM is programmed by loading it with data. The data in the PROM is then checked for any programming errors.

Logic devices, on the other hand, are programmed using a different sequence of programming steps. The logic structure of a programmable logic array is first defined in the system design, as opposed to a computer program. The logic structure is then specified using some type of data preparation system. Once the logic structure specification has been input to the data preparation system, a fuse pattern for the device to be programmed is generated and used to program the device. Like PROMs, the programming of logic devices should be verified after programming. In order to test the functionality of programmable logic devices, it is necessary to implement some type of functional testing in which the device is exercised and its responses determined, such as by comparing the response to the response of a device known to be operating properly.

Functional tests of programmable logic devices are conventionally performed using various testing methodologies, depending upon whether combinatorial or sequential logic is involved. Combinatorial devices are the easiest devices to test since the outputs are a function of only the input conditions. Combinatorial devices are, therefore, very receptive to generalized testing algorithms. Sequential logic, on the other hand, imposes rigid requirements on a testing scheme because the outputs are a function of not only the current inputs but also the previous state of the device. Sequential devices are, therefore, not usually receptive to generalized testing algorithms.

One functional testing algorithm involves transition counting. In transition counting, the device inputs are subjected to a changing test pattern. As the pattern changes, transitions in the output occur; and these transitions are counted to verify that the correct number of transitions has occurred.

Logic simulation is another method of determining the functionality of programmable logic devices. To simulate the device, the device's logic structure must be defined on a computer; and the simulated device is then subjected to a test pattern. The output of the simulation will tell whether or not the device's logic structure is responding correctly to the input test pattern.

Another testing technique, known as "structure testing," involves the use of a test pattern that, for combinatorial devices, will consist of every possible input state for the device. For sequential devices, structure testing patterns are structured such that the device will go through all of its programmed state transitions.

All of the above testing techniques have certain limitations. Transition counting, for example, is limited to only certain types of errors. If more than one device output is defective, the error detection probability becomes significantly less than for single output errors. This is because a defective device can cause the correct number of transitions to occur even though two device outputs are defective. Structure tests and simulation require large amounts of time to generate all of the possible input states. This is particularly inefficient since, for most logic devices, only a small portion of the possible input states actually occur in use.

DISCLOSURE OF INVENTION

It is an object of the invention to provide a system that can automatically test for the proper functioning of a wide variety of logic devices, including progammable logic devices.

It is another object of the invention to provide a system that is capable of testing the functionality of sequential logic devices as well as combinatorial devices.

It is still another object of the invention to provide a functional testing system for logic devices that can be set up for testing without manually generating a detailed test procedure based upon a detailed knowledge of the device's function.

It is a further object of the invention to provide a functional testing system for logic devices that has a high probability of detecting all types of errors including those exhibiting the same number of transitions as a properly functioning device.

These and other objects of the invention are provided by a system for testing logic devices having a plurality of electrical contacts. Although the system is primarily suited for testing programmable logic devices, it is also capable of testing virtually any logic device that generates specific outputs in response to various combinations of inputs. The functional testing system includes a multi-stage shift register generating a test vector that is applied to the logic device under test through respective isolation elements. As a result, all contact pins of the logic device can be treated alike regardless of whether they are inputs or outputs. The logic levels on pins serving as inputs are controlled by the corresponding shift register stage and the logic level on contact pins serving as outputs are controlled by the logic device. After the logic device has responded to the test vector in the shift register, a new test vector is created from the response. The new test vector is created by applying the outputs of several shift register stages to an exclusive OR-gate along with at least some of the contact pins of the logic device. The output of the exclusive OR-gate is applied to the input of the first shift register stage. The shift register stages applied to the exclusive OR-gate are selected to maximize the pseudo-random nature of the new test vector. Although the contact pins of the logic device can be applied simultaneously to the exclusive OR-gate, they can also be sequentially applied through a multiplexer, thereby reducing the number of necessary inputs to the exclusive OR-gate, but increasing the amount of time required to create the new test vector. Where a multiplexer is used in this manner, the logic device does not respond to the contents of the shift register until the new test vector is created by sequentially applying a predetermined number of contact pins to the exclusive OR-gate while shifting the output of the exclusive OR-gate into the shift register. The logic device then responds to the contents of the shift register while the shift register is prevented from shifting data from one stage to the next. Each cycle of the test thus consists of a stage in which the new test vector is built and a stage in which the logic device under test responds to the new test vector. Each such cycle is counted and when a predetermined number of cycles have been completed, the final test vector in the shift register is read out and compared with the test vector that was in the shift register when the same test was performed on another logic device identical to the device under test and known to be functioning properly. While all contact pins of the device under test may be driven by the shift register, provision is also made for treating certain pins such as the enable and clock inputs separately so that the logic device is not pseudo-randomly clocked and enabled. The system thus not only determines the functionality of the device under test, but it also provides the stimulus to the device.

BEST MODE FOR CARRYING OUT THE INVENTION

Figure 1:
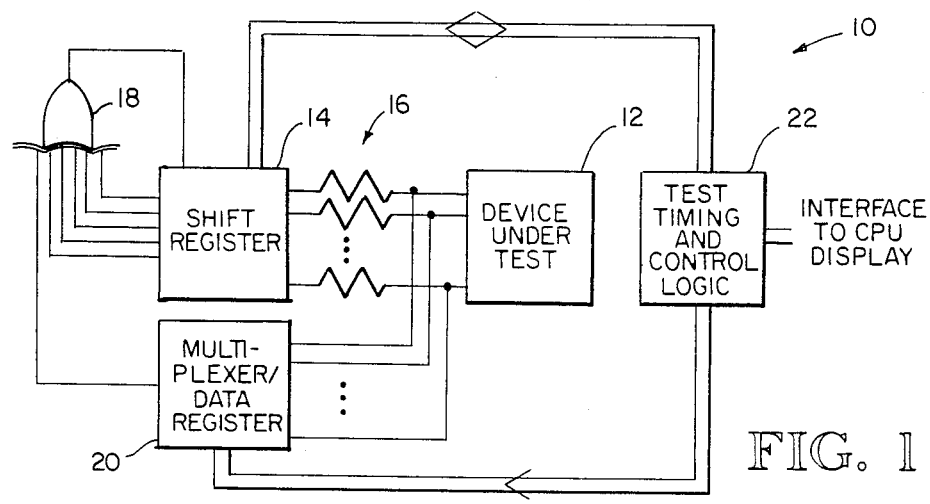
FIG. 1 is a block diagram illustrating the basic concept of the functional testing system.

The basic system concept of the testing device 10 of the present invention for testing digital logic devices is illustrated in FIG. 1. Each input/output pin of a programmable logic device under test 12 is connected to a corresponding output of a shift register 14 through a respective isolation element, such as a resistor 16. The outputs of certain shift registers are also applied to an exclusive OR gate 18, and the output of the gate is applied to the input of the shift register 14. A multiplexer 20 sequentially connects each of the pins of the device under test 12 to a remaining input of the exclusive OR gate 18. The shift register 14 and multiplexer 20 are driven by a timing and control logic circuit 22 so that the data shifts through the shift register in synchronism with the switching of each pin of the device under test 12 to the exclusive OR gate 18. The shift register 14 thus provides the stimulous for the device under test 12 as well as a means for detecting an incorrect response thereto.

The shift register 14 treats all datacarrying pins of the device under test 12 the same, regardless of whether they are inputs or outputs. The shift register 14 thus generates the input signals to the device under test 12. In the event that a pin of the device under test 12 is an output instead of an input, the low impedance at the output of the device under test 12 controls the voltage level on the pin. The state of the shift register 14 is a pseudo-random sequence. This sequence depends not only upon the preset initial state of the shift register, but also, all states of the shift register 14 occurring thereafter. These states, in turn, are a function of the programming in the device under test 12. By properly choosing certain outputs of the shift register 14 to be applied to the exclusive OR gate 18 in accordance with known mathematical techniques, the pseudo-random nature of the shift register 14 can be maximized, providing a more complete stimulus to the device under test 12.

The primary advantage of treating all pins of the device under test 12 alike, without regard to whether they are inputs or outputs, is that the testing is simplified since the function of the device need not be known. The device under test 12 is merely connected to the shift register 14, the shift register 14 is preset to an initial state, and a given number of clock pulses are applied to the shift register 14 and multiplexer 20. The resulting condition of the shift register 14 or "signature" is then compared to the signature obtained from the shift register 14 when a device under test 12 known to be functioning properly has undergone the testing procedure in the identical manner. The system 10 can, therefore, be set up to test a programmable logic device 12 quickly and easily since it is not necessary to manually generate a detailed test procedure based upon the function of the device 12.

Instead of feeding the pins of the device under test 12 to the exclusive OR gate 18 with the multiplexer 20, all of the pins of the device under test 12 could be directly connected to respective inputs of the exclusive OR gate 18. The advantage of the multiplexer 20 is that the size of the exclusive OR gate 18 can be reduced. Conversely, the disadvantage of the multiplexer 20 is that in order to test all of the pins of the device under test 12, the multiplexer must apply each of the pins to the shift register 14 in sequence before a new set of inputs is applied to the device under test. Thus, the test requires a relatively longer time to complete.

Figure 2:
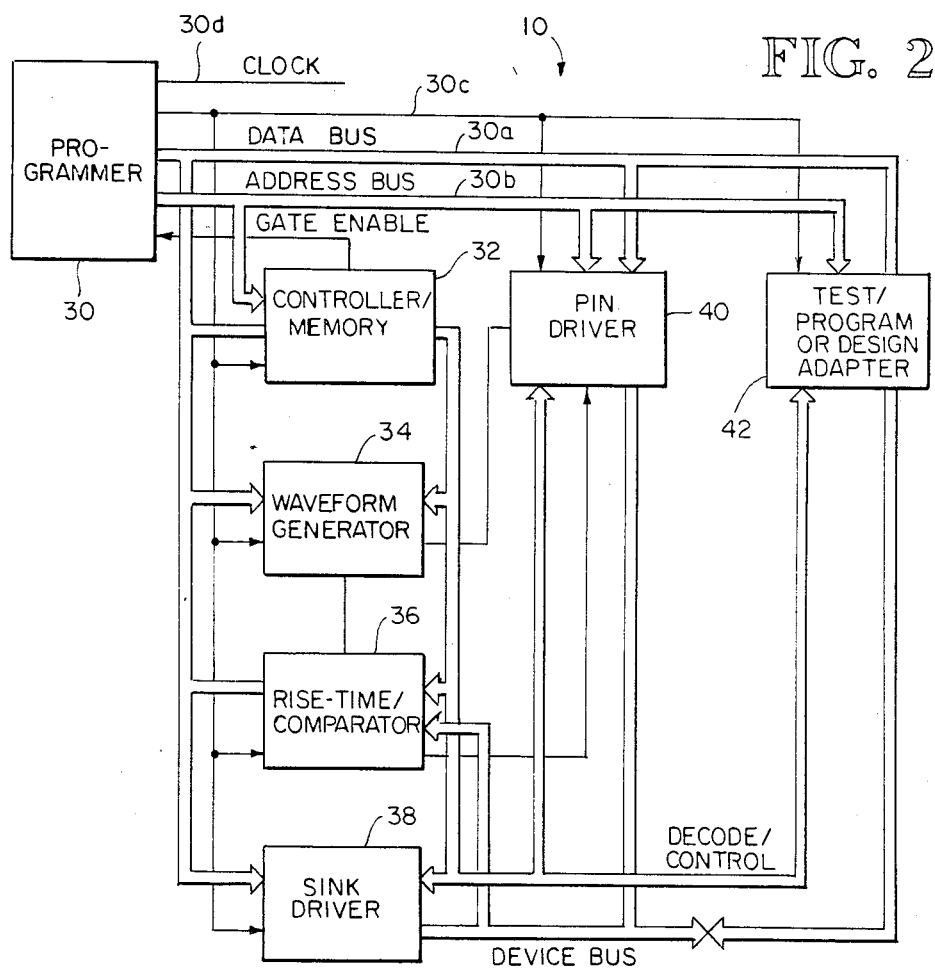
FIG. 2 is a block diagram of one embodiment of the testing system.

One embodiment of a testing device 10 implementing the system concept illustrated in FIG. 1 is shown in the block diagram of FIG. 2. The testing device 10 is in the form of an add-on circuit to a conventional PROM programmer 30, such as a Model 29-A or a 100-A universal programmer sold by Data I/O Corporation of Redmond, Wash. The universal programmer 30 is a microprocessor-based device that includes a data bus 30a, an address bus 30b, a read/write line 30c, and an internal clock (not shown) with a clock line 30d. The testing device 10 further includes a controller/memory board 32 that generates timing and control signals and decodes the address bus 30b to generate various enabling signals, contains software common to all programmable logic devices to be tested, and facilitates the reading of the signature from the shift register 14. Also provided are a waveform generator 34, which generates software-controlled analog voltages that are applied to the device under test 12; a rise-time comparator 36, which generates signals having software-controlled rise time for programming the programmable logic device under test 12 prior to testing and provides comparison of signal levels of the device under test 12 to predetermined values; a sink driver 38, which includes the shift register 14 (FIG. 1), the exclusive OR gate 18, and circuitry for applying the outputs of the shift register 14 to respective pins of the device under test 12; a pin driver 40 for applying logic levels from the waveform generator 34 to program the programmable logic device under test 12; and an adaptor module 42. The adaptor module 42 contains software that is specific to the particular programmable logic device being programmed and tested, and it is the unit that physically receives the device under test 12. Each of these subsystems described above is explained in detail below.

Figure 3:
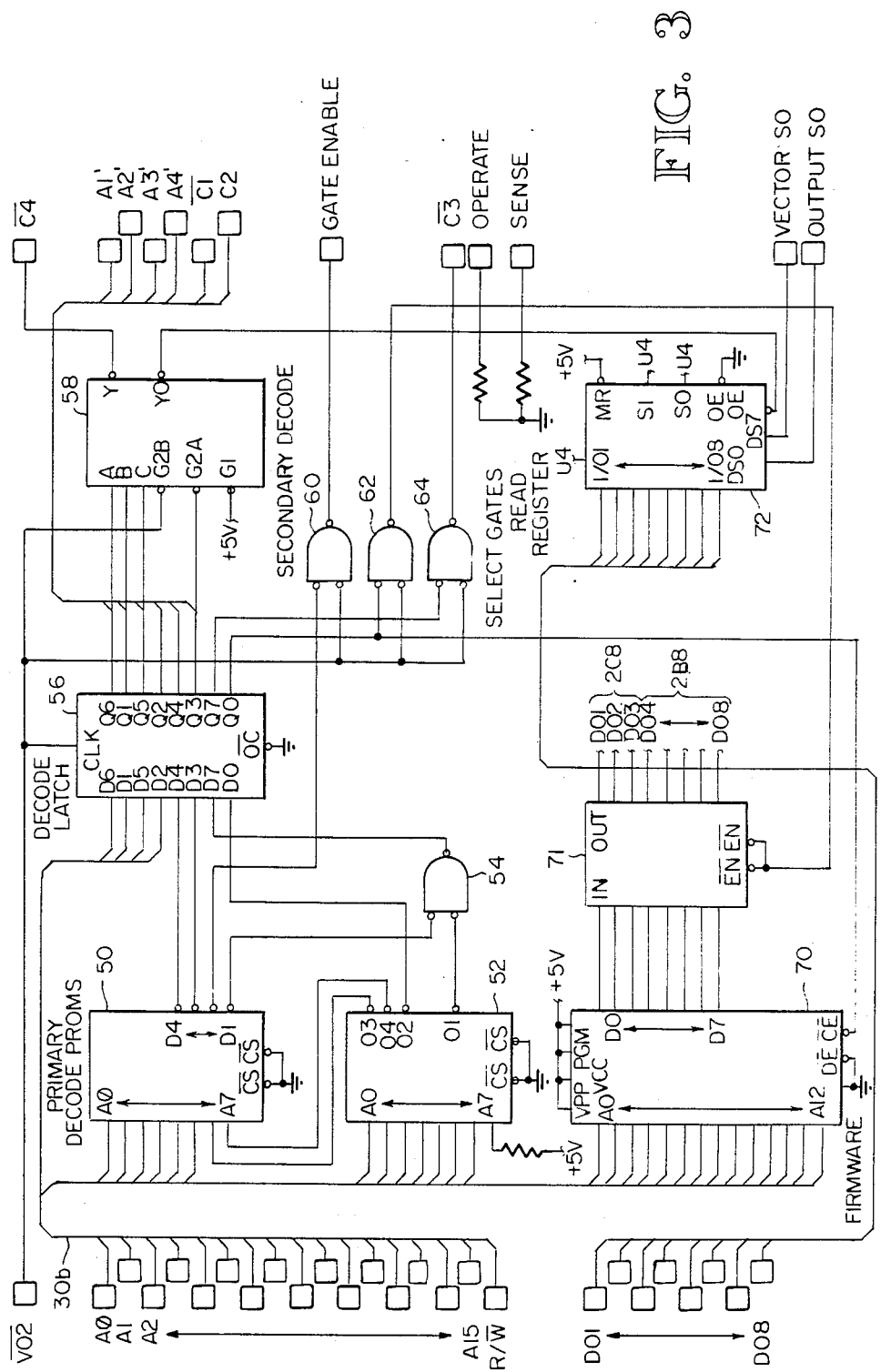
FIG. 3 is a schematic of the memory subsystem of the functional testing system that generates enabling and control signals from addresses of the programmer and outputs the final test vector to the programmer.

A schematic of a memory portion of the controller/memory board 32 is illustrated in FIG. 3. The address bus 30b of the programmer 30 includes sixteen address bits. For each of $2^{16}$ states of the address bus 30b, predetermined functions must occur in the system. As a result, the sixteen address bits are decoded to provide a number of enabling or control signals. The basic concept behind this decoding is to perform a primary decode in which a four-bit control word and several enable signals are generated. The control word is applied to several secondary decoder circuits in parallel, each of which is enabled by its individual enable signal. In this manner, a large number of control signals are generated to implement certain functions on the basis of selected addresses of $2^{16}$ possible addresses. The twelve high-order bits of the address bus 30b are applied to a pair of primary decoder PROMs 50,52, each of which generates predetermined combinations of four-bit outputs for each combination of input or address. As mentioned above, the decoder PROMs 50,52 generate enable signals for other portions of the circuit, depending upon the particular address received from the programmer 30. The high-order outputs from the decoder PROM 52 are used as high-order address bits for the decoder PROM 50. An OR gate 54 is used to generate an extra output bit for certain addresses in which either the $Q_1$ output of decoder PROM 50 or the $Q_1$ output of decoder PROM 52 is high.

The outputs of PROM 50 for various addresses are as shown in the following truth table:

| Decoder Prom 50 | | | |
|---|---|---|---|
| Dec Addr. | Binary Data | Dec Addr. | Binary Data |
| 000 | 1 1 1 1 | 051 | 1 1 1 1 |
| 001 | 1 1 1 1 | 052 | 1 1 1 1 |
| 002 | 1 1 1 1 | 053 | 1 1 1 1 |
| 003 | 1 1 1 1 | 054 | 1 1 1 1 |
| 004 | 1 1 1 1 | 055 | 1 1 1 1 |
| 005 | 1 1 1 1 | 056 | 1 1 1 1 |
| 006 | 1 1 1 1 | 057 | 1 1 1 1 |
| 007 | 1 1 1 1 | 058 | 1 1 1 1 |
| 008 | 1 1 1 1 | 059 | 1 1 1 1 |
| 009 | 1 1 1 1 | 060 | 1 1 1 1 |
| 010 | 1 1 1 1 | 061 | 1 1 1 1 |
| 011 | 1 1 1 1 | 062 | 1 1 1 1 |
| 012 | 1 1 1 1 | 063 | 1 1 1 1 |
| 013 | 1 1 1 1 | 064 | 1 1 1 1 |
| 014 | 0 1 0 1 | 065 | 1 1 1 1 |
| 015 | 0 1 0 1 | 066 | 1 1 1 1 |
| 016 | 1 1 1 1 | 067 | 1 1 1 1 |
| 017 | 1 1 1 1 | 068 | 1 1 1 1 |
| 018 | 1 1 1 1 | 069 | 1 1 1 1 |
| 019 | 1 1 1 1 | 070 | 1 1 1 1 |
| 020 | 1 1 1 1 | 071 | 1 1 1 1 |
| 021 | 1 1 1 1 | 072 | 1 1 1 1 |
| 022 | 1 1 1 1 | 073 | 1 1 1 1 |
| 023 | 1 1 1 1 | 074 | 1 1 1 1 |
| 024 | 1 1 1 1 | 075 | 1 1 1 1 |
| 025 | 1 1 1 1 | 076 | 1 1 1 1 |
| 026 | 1 1 1 1 | 077 | 1 1 1 1 |
| 027 | 1 1 1 1 | 078 | 1 1 1 1 |
| 028 | 1 1 1 1 | 079 | 1 1 1 1 |
| 029 | 1 1 1 1 | 080 | 1 1 1 1 |
| 030 | 1 1 1 1 | 081 | 1 1 1 1 |
| 031 | 1 1 1 1 | 082 | 1 1 1 1 |
| 032 | 1 1 1 1 | 083 | 1 1 1 1 |
| 033 | 1 1 1 1 | 084 | 1 1 1 1 |
| 034 | 1 1 1 1 | 085 | 1 1 1 1 |
| 035 | 1 1 1 1 | 086 | 1 1 1 1 |
| 036 | 1 1 1 1 | 087 | 1 1 1 1 |
| 037 | 1 1 1 1 | 088 | 1 1 1 1 |
| 038 | 1 1 1 1 | 089 | 1 1 1 1 |
| 039 | 1 1 1 1 | 090 | 1 1 1 1 |
| 040 | 1 1 1 1 | 091 | 1 1 1 1 |
| 041 | 1 1 1 1 | 092 | 1 1 1 1 |
| 042 | 1 1 1 1 | 093 | 1 1 1 1 |
| 043 | 1 1 1 1 | 094 | 1 1 1 1 |
| 044 | 1 1 1 1 | 095 | 1 1 1 1 |
| 045 | 1 1 1 1 | 096 | 1 1 0 0 |
| 046 | 1 1 1 1 | 097 | 1 1 0 0 |
| 047 | 1 1 1 1 | 098 | 1 1 0 0 |
| 048 | 1 1 1 1 | 099 | 1 1 0 0 |
| 049 | 1 1 1 1 | 100 | 1 1 0 0 |
| 050 | 1 1 1 1 | 101 | 1 1 0 0 |
| 102 | 1 1 0 0 | 153 | 1 1 1 1 |
| 103 | 1 1 0 0 | 154 | 1 1 1 1 |
| 104 | 1 1 0 0 | 155 | 1 1 1 1 |
| 105 | 1 1 0 0 | 156 | 1 1 1 1 |
| 106 | 1 1 0 0 | 157 | 1 1 1 1 |
| 107 | 1 1 0 0 | 158 | 1 1 1 1 |
| 108 | 1 1 0 0 | 159 | 1 1 1 1 |
| 109 | 1 1 0 0 | 160 | 1 1 0 0 |
| 110 | 1 1 0 0 | 161 | 1 1 0 0 |
| 111 | 1 1 0 0 | 162 | 1 1 0 0 |
| 112 | 1 1 0 0 | 163 | 1 1 0 0 |
| 113 | 1 1 0 0 | 164 | 1 1 0 0 |
| 114 | 1 1 0 0 | 165 | 1 1 0 0 |
| 115 | 1 1 0 0 | 166 | 1 1 0 0 |
| 116 | 1 1 0 0 | 167 | 1 1 0 0 |
| 117 | 1 1 0 0 | 168 | 1 1 0 0 |
| 118 | 1 1 0 0 | 169 | 1 1 0 0 |
| 119 | 1 1 0 0 | 170 | 1 1 0 0 |
| 120 | 1 1 0 0 | 171 | 1 1 0 0 |
| 121 | 1 1 0 0 | 172 | 1 1 0 0 |
| 122 | 1 1 0 0 | 173 | 1 1 0 0 |

-continued

| \multicolumn{4}{c}{Decoder Prom 50} |
| Dec Addr. | Binary Data | Dec Addr. | Binary Data |
| --- | --- | --- | --- |
| 123 | 1 1 0 0 | 174 | 1 1 0 0 |
| 124 | 1 1 0 0 | 175 | 1 1 0 0 |
| 125 | 1 1 0 0 | 176 | 1 1 0 0 |
| 126 | 1 1 0 0 | 177 | 1 1 0 0 |
| 127 | 1 0 0 1 | 178 | 1 1 0 0 |
| 128 | 1 1 1 1 | 179 | 1 1 0 0 |
| 129 | 1 1 1 1 | 180 | 1 1 0 0 |
| 130 | 1 1 1 1 | 181 | 1 1 0 0 |
| 131 | 1 1 1 1 | 182 | 1 1 0 0 |
| 132 | 1 1 1 1 | 183 | 1 1 0 0 |
| 133 | 1 1 1 1 | 184 | 1 1 0 0 |
| 134 | 1 1 1 1 | 185 | 1 1 0 0 |
| 135 | 1 1 1 1 | 186 | 1 1 0 0 |
| 136 | 1 1 1 1 | 187 | 1 1 0 0 |
| 137 | 1 1 1 1 | 188 | 1 1 0 0 |
| 138 | 1 1 1 1 | 189 | 1 1 0 0 |
| 139 | 1 1 1 1 | 190 | 1 1 0 0 |
| 140 | 1 1 1 1 | 191 | 1 1 0 0 |
| 141 | 1 1 1 1 | 192 | 1 1 1 1 |
| 142 | 1 1 1 1 | 193 | 1 1 1 1 |
| 143 | 1 1 1 1 | 194 | 1 1 1 1 |
| 144 | 1 1 1 1 | 195 | 1 1 1 1 |
| 145 | 1 1 1 1 | 196 | 1 1 1 1 |
| 146 | 1 1 1 1 | 197 | 1 1 1 1 |
| 147 | 1 1 1 1 | 198 | 1 1 1 1 |
| 148 | 1 1 1 1 | 199 | 1 1 1 1 |
| 149 | 1 1 1 1 | 200 | 1 1 1 1 |
| 150 | 1 1 1 1 | 201 | 1 1 1 1 |
| 151 | 1 1 1 1 | 202 | 1 1 1 1 |
| 152 | 1 1 1 1 | 203 | 1 1 1 1 |
| 204 | 1 1 1 1 | | |
| 205 | 1 1 1 1 | | |
| 206 | 1 1 1 1 | | |
| 207 | 1 1 1 1 | | |
| 208 | 1 1 1 1 | | |
| 209 | 1 1 1 1 | | |
| 210 | 1 1 1 1 | | |
| 211 | 1 1 1 1 | | |
| 212 | 1 1 1 1 | | |
| 213 | 1 1 1 1 | | |
| 214 | 1 1 1 1 | | |
| 215 | 1 1 1 1 | | |
| 216 | 1 1 1 1 | | |
| 217 | 1 1 1 1 | | |
| 218 | 1 1 1 1 | | |
| 219 | 1 1 1 1 | | |
| 220 | 1 1 1 1 | | |
| 221 | 1 1 1 1 | | |
| 222 | 1 1 1 1 | | |
| 223 | 1 1 1 1 | | |
| 224 | 1 1 1 1 | | |
| 225 | 1 1 1 1 | | |
| 226 | 1 1 1 1 | | |
| 227 | 1 1 1 1 | | |
| 228 | 1 1 1 1 | | |
| 229 | 1 1 1 1 | | |
| 230 | 1 1 1 1 | | |
| 231 | 1 1 1 1 | | |
| 232 | 1 1 1 1 | | |
| 233 | 1 1 1 1 | | |
| 234 | 1 1 1 1 | | |
| 235 | 1 1 1 1 | | |
| 236 | 1 1 1 1 | | |
| 237 | 1 1 1 1 | | |
| 238 | 1 1 1 1 | | |
| 239 | 1 1 1 1 | | |
| 240 | 1 1 1 1 | | |
| 241 | 1 1 1 1 | | |
| 242 | 1 1 1 1 | | |
| 243 | 1 1 1 1 | | |
| 244 | 1 1 1 1 | | |
| 245 | 1 1 1 1 | | |
| 246 | 1 1 1 1 | | |
| 247 | 1 1 1 1 | | |
| 248 | 1 1 1 1 | | |
| 249 | 1 1 1 1 | | |
| 250 | 1 1 1 1 | | |
| 251 | 1 1 1 1 | | |

-continued

| \multicolumn{4}{c}{Decoder Prom 50} |
| Dec Addr. | Binary Data | Dec Addr. | Binary Data |
| --- | --- | --- | --- |
| 252 | 1 1 1 1 | | |
| 253 | 1 1 1 1 | | |
| 254 | 1 1 1 1 | | |
| 255 | 1 1 1 1 | | |

The outputs of PROM 52 for various addresses are as shown in the following truth table:

| \multicolumn{4}{c}{Decoder Prom 52} |
| Dec Addr. | Binary Data | Dec. Addr. | Binary Data |
| --- | --- | --- | --- |
| 000 | 0 0 1 1 | 051 | 1 0 1 0 |
| 001 | 1 1 1 1 | 052 | 1 0 1 0 |
| 002 | 1 1 1 1 | 053 | 1 0 1 0 |
| 003 | 1 1 1 1 | 054 | 1 0 1 0 |
| 004 | 1 1 1 1 | 055 | 1 0 1 0 |
| 005 | 1 1 1 1 | 056 | 1 0 1 0 |
| 006 | 1 1 1 1 | 057 | 1 0 1 0 |
| 007 | 1 1 1 1 | 058 | 1 0 1 0 |
| 008 | 1 1 1 1 | 059 | 1 0 1 0 |
| 009 | 1 1 1 1 | 060 | 1 0 1 0 |
| 010 | 1 1 1 1 | 061 | 1 0 1 0 |
| 011 | 1 1 1 1 | 062 | 1 0 1 0 |
| 012 | 1 1 1 1 | 063 | 1 0 1 0 |
| 013 | 1 1 1 1 | 064 | 1 0 1 0 |
| 014 | 1 1 1 1 | 065 | 1 0 1 0 |
| 015 | 1 1 1 1 | 066 | 1 0 1 0 |
| 016 | 1 1 1 1 | 067 | 1 0 1 0 |
| 017 | 1 1 1 1 | 068 | 1 0 1 0 |
| 018 | 1 1 1 1 | 069 | 1 0 1 0 |
| 019 | 1 1 1 1 | 070 | 1 0 1 0 |
| 020 | 1 1 1 1 | 071 | 1 0 1 0 |
| 021 | 1 1 1 1 | 072 | 1 0 1 0 |
| 022 | 1 1 1 1 | 073 | 1 0 1 0 |
| 023 | 1 1 1 1 | 074 | 1 0 1 0 |
| 024 | 1 1 1 1 | 075 | 1 0 1 0 |
| 025 | 1 1 1 1 | 076 | 1 0 1 0 |
| 026 | 1 1 1 1 | 077 | 1 0 1 0 |
| 027 | 1 1 1 1 | 078 | 1 0 1 0 |
| 028 | 1 1 1 1 | 079 | 0 1 1 0 |
| 029 | 1 1 1 1 | 080 | 1 1 1 1 |
| 030 | 1 1 1 1 | 081 | 1 1 1 1 |
| 031 | 1 1 1 1 | 082 | 1 1 1 1 |
| 032 | 1 1 1 1 | 083 | 1 1 1 1 |
| 033 | 1 1 1 1 | 084 | 1 1 1 1 |
| 034 | 1 1 1 1 | 085 | 1 1 1 1 |
| 035 | 1 1 1 1 | 086 | 1 1 1 1 |
| 036 | 1 1 1 1 | 087 | 1 1 1 1 |
| 037 | 1 1 1 1 | 088 | 1 1 1 1 |
| 038 | 1 1 1 1 | 089 | 1 1 1 1 |
| 039 | 1 1 1 1 | 090 | 1 1 1 1 |
| 040 | 1 1 1 1 | 091 | 1 1 1 1 |
| 041 | 1 1 1 1 | 092 | 1 1 1 1 |
| 042 | 1 1 1 1 | 093 | 1 1 1 1 |
| 043 | 1 1 1 1 | 094 | 1 1 1 1 |
| 044 | 1 1 1 1 | 095 | 1 1 1 1 |
| 045 | 1 1 1 1 | 096 | 1 1 1 1 |
| 046 | 1 1 1 1 | 097 | 1 1 1 1 |
| 047 | 1 1 1 1 | 098 | 1 1 1 1 |
| 048 | 1 0 1 0 | 099 | 1 1 1 1 |
| 049 | 1 0 1 0 | 100 | 1 1 1 1 |
| 050 | 1 0 1 0 | 101 | 1 1 1 1 |
| 102 | 1 1 1 1 | 153 | 1 1 1 1 |
| 103 | 1 1 1 1 | 154 | 1 1 1 1 |
| 104 | 1 1 1 1 | 155 | 1 1 1 1 |
| 105 | 1 1 1 1 | 156 | 1 1 1 1 |
| 106 | 1 1 1 1 | 157 | 1 1 1 1 |
| 107 | 1 1 1 1 | 158 | 1 1 1 1 |
| 108 | 1 1 1 1 | 159 | 1 1 1 1 |
| 109 | 1 1 1 1 | 160 | 1 1 1 1 |
| 110 | 1 1 1 1 | 161 | 1 1 1 1 |
| 111 | 1 1 1 1 | 162 | 1 1 1 1 |
| 112 | 1 1 1 1 | 163 | 1 1 1 1 |
| 113 | 1 1 1 1 | 164 | 1 1 1 1 |
| 114 | 1 1 1 1 | 165 | 1 1 1 1 |

-continued

| \multicolumn{4}{c}{Decoder Prom 52} |
| Dec Addr. | Binary Data | Dec. Addr. | Binary Data |
| --- | --- | --- | --- |
| 115 | 1 1 1 1 | 166 | 1 1 1 1 |
| 116 | 1 1 1 1 | 167 | 1 1 1 1 |
| 117 | 1 1 1 1 | 168 | 1 1 1 1 |
| 118 | 1 1 1 1 | 169 | 1 1 1 1 |
| 119 | 1 1 1 1 | 170 | 1 1 1 1 |
| 120 | 1 1 1 1 | 171 | 1 1 1 1 |
| 121 | 1 1 1 1 | 172 | 1 1 1 1 |
| 122 | 1 1 1 1 | 173 | 1 1 1 1 |
| 123 | 1 1 1 1 | 174 | 1 1 1 1 |
| 124 | 1 1 1 1 | 175 | 1 1 1 1 |
| 125 | 1 1 1 1 | 176 | 1 0 0 1 |
| 126 | 1 1 1 1 | 177 | 1 0 0 1 |
| 127 | 1 1 1 1 | 178 | 1 0 0 1 |
| 128 | 0 0 1 1 | 179 | 1 0 0 1 |
| 129 | 1 1 1 1 | 180 | 1 0 0 1 |
| 130 | 1 1 1 1 | 181 | 1 0 0 1 |
| 131 | 1 1 1 1 | 182 | 1 0 0 1 |
| 132 | 1 1 1 1 | 183 | 1 0 0 1 |
| 133 | 1 1 1 1 | 184 | 1 0 0 1 |
| 134 | 1 1 1 1 | 185 | 1 0 0 1 |
| 135 | 1 1 1 1 | 186 | 1 0 0 1 |
| 136 | 1 1 1 1 | 187 | 1 0 0 1 |
| 137 | 1 1 1 1 | 188 | 1 0 0 1 |
| 138 | 1 1 1 1 | 189 | 1 0 0 1 |
| 139 | 1 1 1 1 | 190 | 1 0 0 1 |
| 140 | 1 1 1 1 | 191 | 1 0 0 1 |
| 141 | 1 1 1 1 | 192 | 1 0 1 0 |
| 142 | 1 1 1 1 | 193 | 1 0 1 0 |
| 143 | 1 1 1 1 | 194 | 1 0 1 0 |
| 144 | 1 1 1 1 | 195 | 1 0 1 0 |
| 145 | 1 1 1 1 | 196 | 1 0 1 0 |
| 146 | 1 1 1 1 | 197 | 1 0 1 0 |
| 147 | 1 1 1 1 | 198 | 1 0 1 0 |
| 148 | 1 1 1 1 | 199 | 1 0 1 0 |
| 149 | 1 1 1 1 | 200 | 1 0 1 0 |
| 150 | 1 1 1 1 | 201 | 1 0 1 0 |
| 151 | 1 1 1 1 | 201 | 1 0 1 0 |
| 152 | 1 1 1 1 | 203 | 1 0 1 0 |
| 206 | 1 0 1 0 | | |
| 207 | 0 1 1 0 | | |
| 208 | 1 1 1 1 | | |
| 209 | 1 1 1 1 | | |
| 210 | 1 1 1 1 | | |
| 211 | 1 1 1 1 | | |
| 212 | 1 1 1 1 | | |
| 213 | 1 1 1 1 | | |
| 214 | 1 1 1 1 | | |
| 215 | 1 1 1 1 | | |
| 216 | 1 1 1 1 | | |
| 217 | 1 1 1 1 | | |
| 218 | 1 1 1 1 | | |
| 219 | 1 1 1 1 | | |
| 220 | 1 1 1 1 | | |
| 221 | 1 1 1 1 | | |
| 222 | 1 1 1 1 | | |
| 223 | 1 1 1 1 | | |
| 224 | 1 1 1 1 | | |
| 225 | 1 1 1 1 | | |
| 226 | 1 1 1 1 | | |
| 227 | 1 1 1 1 | | |
| 228 | 1 1 1 1 | | |
| 229 | 1 1 1 1 | | |
| 230 | 1 1 1 1 | | |
| 231 | 1 1 1 1 | | |
| 232 | 1 1 1 1 | | |
| 233 | 1 1 1 1 | | |
| 234 | 1 1 1 1 | | |
| 235 | 1 1 1 1 | | |
| 236 | 1 1 1 1 | | |
| 237 | 1 1 1 1 | | |
| 238 | 1 1 1 1 | | |
| 239 | 1 1 1 1 | | |
| 240 | 1 1 1 1 | | |

-continued

| \multicolumn{4}{c}{Decoder Prom 52} |
| Dec Addr. | Binary Data | Dec. Addr. | Binary Data |
| --- | --- | --- | --- |
| 241 | 1 1 1 1 | | |
| 242 | 1 1 1 1 | | |
| 243 | 1 1 1 1 | | |
| 244 | 1 1 1 1 | | |
| 245 | 1 1 1 1 | | |
| 246 | 1 1 1 1 | | |
| 247 | 1 1 1 1 | | |
| 248 | 1 1 1 1 | | |
| 249 | 1 1 1 1 | | |
| 250 | 1 1 1 1 | | |
| 251 | 1 1 1 1 | | |
| 252 | 1 1 1 1 | | |
| 253 | 1 1 1 1 | | |
| 254 | 1 1 1 1 | | |
| 255 | 1 1 1 1 | | |

The four lowest order address bits, two outputs from the decoder PROM 50, one output from decoder PROM 52, and an output from the OR gate 54 are applied to a primary decoder latch 56. The decoder latch 56 is clocked by a clock signal $\overline{V02}$ of the internal clock of the programmer 30 carried on the clock line 30d so that it thereafter generates an eight-bit word determined by the address on the address bus 30b of the programmer 30 and the data entered into the decoder PROMs 50,52. Basically, the decoder latch 56 synchronizes the address bus 30b to the clock signal $\overline{V02}$. Four bits A1'-A4' from the decoder latch 56 form the control word mentioned above and are applied to various secondary decoders, as explained in greater detail below. The three remaining bits C1-C3 from the decode latch 56 are used to enable these secondary decoders. One such secondary decoder 58 receives three low-order bits of the control word from the decode latch 56 and is enabled by the $Q_3$ output of the decode latch 56 to generate appropriate signals during a pulse of the clock signal $\overline{V02}$.

The $Q_2$ output of the decoder PROM 50 and the $Q_0$ and $Q_7$ outputs of the decoder latch 56 are applied to respective OR gates 60,62,64, which have their outputs synchronized to the clock signal $\overline{V02}$ of the programmer 30. The OR gate 60 generates a GATE ENABLE signal, the OR gate 64 generates a $\overline{C3}$ signal for enabling other secondary decoders, and the OR gate 62 enables an internal data gate, as explained below. The GATE ENABLE signal is applied to the programmer 30 to allow the programmer 30 to input or output data from its data bus since the data bus is also used for functions internal to the programmer 30.

Figure 4:
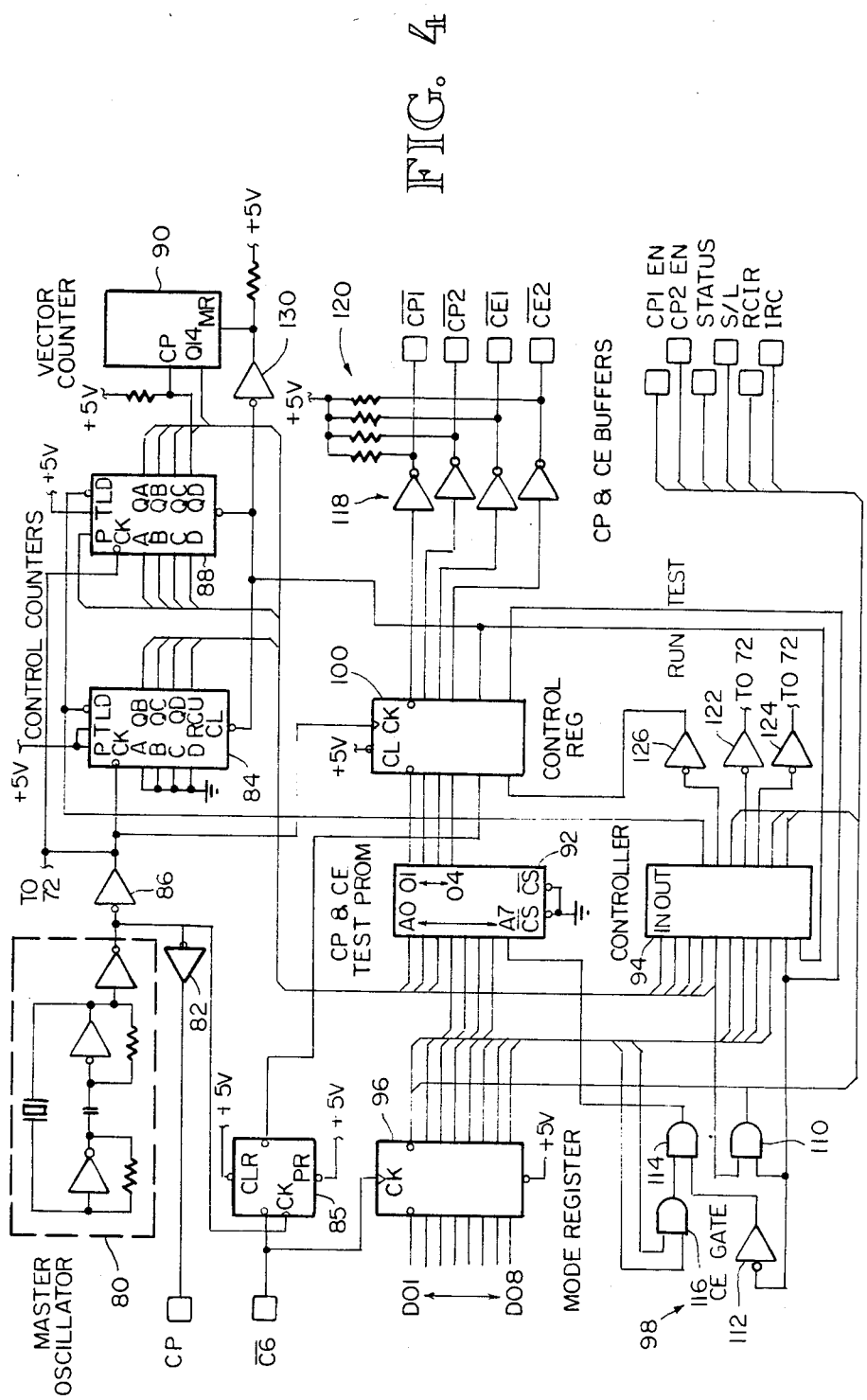
FIG. 4 is a schematic of the controller subsystem of the functional testing system which provides control, clock and enable signals to the device under test and determines when the test should be terminated.

Thirteen bits of the address bus 30b are also applied to a PROM 70, which generates an eight-bit word, depending upon the software contained therein and the particular address applied to the PROM 70. The software in the PROM 70 is common to all programmable logic devices of the type being tested, and is generated whenever the $Q_0$ output of the decoder latch 56 goes low. At that time, a data gate 71 is enabled by the OR gate 62 so that the eight-bit word from the PROM 70 is applied to circuitry on the controller portion of the controller/memory board 32 described below. (FIG. 4). The object code for data stored in the PROM 70 in Motorola Exorciser Format, Code 82, is as follows:

```
S006000048445218
S1137807ED67B4BD67C6BD6C29BD68742488CEBBC3
S11378170BDF97BD7BE38D6C868BD69CACE7B5F32
S11378270ED6756BD675FBD67148D654C25E8B17B6E
```

```
S11378376C24E34836CE7B6DBD69E3EEBB3227D66D
S11378473F0048CE7C8DBD69E3BD7BBF3BEEB0317D
S113785731ADBBBD67C62BCBBDBA434F4D4D414EAB
S11378674420302908BBF7B8B7BE37C9A7C227C2EB8
S11378776150619261CA620500BB6F386C366AB053C
S11378877AA3799BCE7DCDBD6756CE7C8D4F368B4B
S11378973081392F028B076D00270DBD67058620BD
S11378A7BD67B5862DBD67B58DBE324CB17C8C26CD
S11378B7DDCE7E1DBD67563960BB27B70DDA8DB8FA
S11378C77E67308080080893F0B8620BD6705EE35
S11378D7BBBD67563BEEB03131E80839CEB097BD35
S11378E764E5BD644C847D9CB2AD2716CEB2A8BD23
S11378F76510BB602A8BD681625E2B6B2A9BD683999
S11378C7250A39CE7CFDBD6756CE7CF88D5E261B02
S11378C178D63BD71280D7B7B7E7AA38D58BD72685F
S11378C278D530D725920EE8D3A270139BD673B8DBF
S11378C3744BD71F7CE7CC925208D3ABD72172400D3A
S11378C47CE7CDBBD67568D1B26120BD673B8D26BDDB
S11378C577170CE7CE6250220C2BD6756BD673BBDSD
S11378C67780739CE7CFDBD6756CE7D0DBD6756BDAB
S11378C77675F810390CEBB0BBDF1E5D70B79BD7118BE
S11378C8786907E69CABF7D417D497D637D9C7CF832
S11378C977D1C7D157D1C7DBD7D1C7D637D887D632D
S11378CA77D697D637D777D637D4EBBDB000BB7D41A6
S11378CB77D347D237DC37D2B7DC37D417DAD7D6378
S11378CC77DBB494C4C4547414C2B4249542B4552C1
S11378CD7524F52004E4F5420B424C414E4B2BB050BD
S11378CE7524F4752414C4D494E472B452524F52EC
S11378CF7B04C4F41440B5B5534820524554555267
S11378D074E2B544F200B05B524F4752414D0B564584
S11378D17524946590044455649434500524543454F
S11378D2749564500B5452414E534D49540B6555304
S11378D37452B50415454452BE00449535040C41F8
S11378D47590B40454E550B46554E4354494F4E41F3
S11378D574C2B544553342004441544418B454E5445BB6
S11378D67520B564552494659B04F5B94F4EBBE8
S11378D774C4153542B465553345204F5B54494F4E78
S11378D870B524454A4535420434F554E54204F5BC3
S11378D9754494F4EBB464140494C92B5B494E2BB5
S11378DA7434F4452BB0B465534520535540434BBA
S11378DB74543480B445434940414C2B465530345A3
S11378DC72B4441544418B50B0BA444154412B492F9B
S11378DD74F2B434F5250B4524154B49722B2B2B79
S11378DE72B504C4453020B524F4752414D0D494EBBC
S11378DF7472F54455354494E4720B414441580544515
S11378E07522B20434F5B9524947485420313972
S11378E17383208DB8ABB0BDBA3C4553433E202D2BF3
S11378E2742454640F52452B5244F56494E4720ED
S11BC7E374144415B54455280AB033
S11378790EBE9690BD69BD65CD96929B8796F8D69160A
S11378809D986D78E860106882704485A260FC979B20
S113789BDE8E39BD665427B37E799B8D037E78F687
S11378A9BD6704BD66A43F1DDE8CBD65FDBD69D640B
S11378B925B50CEB0B0DF8CCEB08C3F1BDE8C3F000B00
S11378C900D3F24850B4BD69CF271B18227178D0AAF
S11378D924EF0C3F1E3F24850B4810A25F6BD69CF98
S11378E927B3BC20B3BBEEB003131DF8C39BD65FDB02
S11378F9BD69D625143F1DBC3F248504B1E82793CF
S1137909818226F3CEBB0B8C2B044BD787E3FBA5FA4E1
S11379190B27015C37303F1ABD3F24850481022476
S113792904331620EFBD69CF271381E8273A8182F2
S11379392718B81A8273F8B17F2732BC2BDC338D1239
S11379490BD7A4E3F16DE8C7E78F6338DB5BD7A6797
S11379592B0F1C4BF27B2D6908DE8E9B0B9843A40BB1B13
S11379669A70B3FBBCEBB08C39337E789C33DE8CBDB7
S11379796SFD7E7912BD7E54BD7E7922244454349CB
S11379894D414C2B46555345420823203DBB86B07BDD3
S11379936705BD673BCE7985BD6756CEBBB0DF8C9BD
S11379A9BD675FBD67148011A2601398100027216D81
S11379B9654C25D9810A2CD548484848CEB0BCC63F
S11379C9B44869B0169005A26F82BD5860B7BD67B56B
S11379D9DE8CBD65FDBD69D624B3DE8CBD673BBDB8
S11379E96AFF8620BD6795BD65FDBD78B7EC63BA4E6
S11379F9B0027015C1797A9BD67B5862BBD67B5BDEA
S1137AB9675FBD671481B0302726B1312722814E277C
```

```
S1137A1922814C2728814327E6811B27B8811A27C8
S1137A29B48145268139814A26A17E799B96A916A6
S1137A39BD795BCEBB8CBD7A4EDE8C2B93CEBB8C52
S1137A49BD7A672BF486B1ABB119A7B124BF86B1C9
S1137A59ABB19A7BB24B68699A7BBA7B1393FBB9E
S1137A69EEBB27B7BD65FDB9BD6674DF863BEEBBAB
S1137A79313196B6A7BB9687A7B139BD664F8D26B1
S1137A89BD665427BDBD673BDE86BD6AFFBD673BF6
S1137A99BC393F2CCEBDB63F16398DBA2BE7FFB1A9
S1137AA9B3B7BF1F3F7F5D66A4DF88BD67B4DF8668
S1137AB9968798BD686D9889787D78BCE7AA796BB
S1137AC99684B7BD69E3A6BBDE86B9A4BBA7BBBD64
S1137AD967B4DF863FBB4F5FDE86ABBBC9BBB6DFB2
S1137AE986DE8BB9DF8826FBD786978739B6888429
S1117AF9FE8BBB81552783FE69BBDF96288298
S1137B7BBD73963FADBD73D5B69FF28501261731BC
S1137B8B1586AA91A727BF97A7BD73D5BD78B1BD13
S1137B9B77153F142BF396A78155272978BB41CE86
S1137BAB6BBBBBBBDF86CE7E4BDF88FE6BBBBD4ADF
S1137BBBCE8BB2DF86EEBBDF88FE8BBB B6BBB48189
S1137BCB5526B28D35B6BBB48155261DBD8BB58662
S1137BDB5591A727B997A7866BBD69882B12DEA568
S1137BEB27BEA6B3BD69852BB7CE9BBBDFA5DFB8B3
S1137BFB7FBBA8861B97933FAA39DFSA96899B87E4
S1137180978996828692788BD7ADFDE8A27B49CC1
S11371108626B139C6653F13BD7BC5DEB827B8BD94
S1137120668927B3BD66A639BD743EBD677D96B3B7
S1137130810227108681BD74278D19BD73D596B3BE
S1137140810127BDCE24B9C6B44FBD64DEDEBBAD37
S1137150BB7E73C2BD12A7BBA1B8268BBD74B526B7
S1137160F33FBB39C6633F13BD73AF97A9BD7879AD
S1137170167DBBA926B15F43A4BB1B3996B3810242
S11371802725BD739DBD743E96E48AB197E486B26B
S1137190BD742724B1398D1324B139BD71F12684EE
S11371AB86B197C37E73C2C6783F1396AA97ABBD78
S11371B07879A4BB27058DBA24B139BD74B526EBCE
S11371C0BC39BD73AF27B48D28271896E48AB697D7
S11371DBE4BD74362784BD19278B7AB BAB26EC8D9B
S11371EB1B27B986B64394E497E4BC39BD73C2BD55
S1137IFB3986B4BD69C139BD743E86B4BD74272532
S113720BEBBD73AF26B86BD74B526F67E73C2BD7848
S1137210 79A4BB26F12BD5BD743E86B5BD742725CA
S1137220CBBD73AF26C6BD74B526F67E73C2BD748E
S11372304861B97938 68B97B4DE1E86B6BD742719
S1137240825AABD73AFBC27B1BD76BBB425B5BD74C6
S11372508B52BEFBD73C296B439B6B297A8BD697C39
S1137260A6B3848226B62B1886B197A896B33BB2F2
S1137270271BD743E86B3BD74272538D8D3E2539F7
S1137280BD73C296B3B1B127BABD743EDEBBADBB62
S1137290BD73C27BBC3271D96A8B1B226177FBBF7
S11372ABC3B624B7B1B326BD96E48AB797E4BD69D3
S11372B07CEEBBBADBBBD73D5397E71ECBD7168A158
S11372C0BB2618BD74B526F4864BBBD69C127B2BD51
S11372DB39BC3996A97FBBA94D26B37CBBA2BBD73FA
S11372EBD53FB2BE1EBD6674DF86BD6654264C3FB4
S11372FBB9CEBB863F16CEBBBA93FBA3F1A3FAABD69
S113730B3F24B5FF8188278B1A827188 17F27E6E2
S1137310BBC2BED3F2C3FA9BBB22BA8BD744B86679D
S1137320BD74273 98DF57FBBB4BD73AF27B37CBBBE
S1137330B4BD73D5CEBBB43FA92BEFEFFF686B04F
S1137340BBD69C126B96328C5B5B272B84818181DB
S1137350B272BDE86BD673B8656BD67B58630 9BA816
S1137360BD67B5862BBD67B5DB6AFF862BBD67B52C
S1137370 96A98B3BBD67B52B9A84B127D586 4BBD28
S1137380 69CA2BB8FBD71F126B486FF97E696E484CE
S1137390 6BB8A1B97E439862B94949 7 94 39DEA5E6AB
S11373A0B496C226B454545454C4BF5CD7AA39DE3C
S11373BB1EBD69D624BADFB6BD697CEEB9ADBB396D
S11373C04F39DE1EBD65CD9686971E8B2B972C9671
S11373DB87971F972D8DAD96E284F897E286BF97D5
S11373EBE B4F97FE97FC97FA97F84397F643439735
S11373FBF4434397F24343 97FB4397E897EA97ECB3
S113740897EEBCBA39BD74DCBD697CEEBDAD BB7BD5
S1137410BB9B24B879BBB9BDE8EBB8DF8EBD67A1DE1F
S113742B1EBB8DF1E9C953936DE1EBD787E32BD698E
```

```
S113743D7CEED7ADBB39BD697CEED5ADBB39DE1E7A
S1137440C6D8BD65E4DE86DF1EDFB6BD67B4BD6673
S113745DA48DBB8D6196E284B78A6897E23996E2DF
S113746D8AD797E2B62C97EE8D34C67B854B2644B1
S113747B8D25862C97E8B62C97EA8D1B8622297EE1D
S113748D8D1C438D14860743946297E28D098600D0
S113749D97E886D097EA39BD05B43B26BB39CEDDA3
S11374AD0ABD699EB69FF239C67185B826D65C85B9
S11374BD1D26D15C3F1386DF97EE8610439AE497E1
S11374CDE486DA4A26FDB69FF28540270B96E48A95
S11374DD1D97E486DD97EE39C6323F13B69FF285C3
S11374ED80270139C6313F1336CEFFFFDF8C86FF7C
S11374FD97E686D4BD69CABD73D53281D825037E2B
S113750D758B81D1275436BD7723328102274B369D
S113751D866D4394E497E496E48A2D97E4BD75DFBB
S113752D86FA97EE86CC97EC3281D3272D36BD78D8
S113753DD16D77158660439AE497E496E48A4097D6
S113754DE486558D2C3281D42710369GE48A6897AD
S113755DE486AA8D1C3281D52601393686FF8D11F9
S113756D86558D1E3281D627F13686AABD14322D67
S113757DE94397FD434397F24343997F44393F621
S113758D433997F897FA97FC97FE3936BD77273237
S113759DCE75AB81172304C6383F13851027D2BDAC
S11375AD068DD849BD69E3EEDD6ED075D875E37582
S11375BBDD75EA75F27625763A765676637693867A5
S11375CDAA97EC861D8DAA8DB996E28AD797E2B66F
S11375DD09297E8869297EA39BD74B62BFB96E48ABE
S11375ED0797E46DDABD74DC2DFBBD76F2BD72A8A
S11375FD2DF8BD76A6BD739096AA97ABBD73D5BD85
S113760D76E886D1BD742B7BD76F486D1BD69CABDDE
S113761D73AF9F99BD74369E99BD76B120DE86D105
S113762D949426F3398D7FBD76E8860BD74278D19
S113763D76F4BD73AFBD73D520ED8D6ABD739D9691
S113764DAA97ABBD76E886D2BD7427BD76F4BD71FA
S113765DC2DD73D52DE9CEBBDF1EBD717CBD73B1
S113766BD52DF3BD75BFC6D98DBAC69D8D06C668C9
S113767D8DD22DF2D7E2C6DEBD69BB8D75860BD1
S113768D758296E28AD797E2CED01BD699E4FBDDE
S113769D758239BD75BF97E897EA97EC97EE4C264B
S11376ADF59D4F4F2DF086D4BD69CA3F2784BD7411
S11376BD4BDE8C3FD0BD78A93DEED031319C8C2626
S11376CD188182270GBD65FD082009BD65FD8CDB73
S11376DD002701D9BD5674DF8CDE8CBD65FDEDD9C4
S11376ED624CEDF1EDFB63DBD67A1BD74DCBD74BD
S11376FDB6398DF496E48A8D97E4868D4394E497BF
S113770BE4398AD7F97EDC6D1BD69BB69FFD36869F
S113771DDF97ED323986FF9789864997EA86499719
S113772DE82D0F86D12D014F9789BD62C97EA862C42
S113773D97E84F978ABD7582BD757196E28AD7975F
S113774DE286FF97E6CEDBFDC61F860136BD77F1CC
S113775DCB40861997EE329588275BD77F1CD08
S113776D9588264E43A7D04336863F97EEBD77F1B2
S113777DC4D32958826378D789588273357DD089CA
S113778D2A18C18F26D485F3261D36A7D886C897C1
S113779DEE8D5E6FD83295882717C7CD08ACD4D48B5
S11377AD24AA43A7D0D808CB1DC15F269D39C6ABBD
S11377BB2006C6CD2DD2C6EDDB8A7DD8926D2C6F8
S11377CD0763F133FD03637863D97EE8610439AE4B5
S11377DD97E4C6D2BD69BB69FF23696E48A109759
S11377ED43284402703BD772733323DEE0D313151
S11377FD39D7ED36B101B69FFD9788860897E0328B
S113780D39862697EE863397EA86339TE886559726
S113781BEC96E28AD797E24FBD75824ABD7571C64D
S113782B9FD7EDF69FF2C5D427F9861DBD77D28141
S113783D29261E862BBD7702810526158630BD7780
S113784D02810926DC8640BD77028ID826D37E737D
S113785BD57E77BFBD7440BDE8CBD65FDDF1EDFB6D4
S113786D86D6BD74277FDB4BD73AF27D37CDDB4C4
S1D0C787BBD73D5CEDDB43F1A39F2
S113780D555577E707D7E71287E717C7E72687E71AB
S113781DF77E7217E722E7E74E87E7118DCDA392D
S113782D7E72599534D7E78647E706A7E68397E68C4
S113783D7453A6EF7E7AF6EE7E789CED7E7A87EC8A
S113784D7E6AD5EB7E6C36EA7E6F08E97E6D4AE86C
S113785B7E6DA9E77E6111E67E6137E57E6144E1E9
```

```
S11370607E7B07FFBD77C37E6881BD77C37E6816CC
S1136A05BD67C6BD67B4BD66A4BD6ACFBD674ACEC2
S1136A150000DF9CDF1EC6028D7DBD6AD7C6448D8E
S1136A2576D697BD6B1ED698BD6B1E8D68C6468DF2
S1136A3566C6308D628D0F6240F7C501270C8D5539
S1136A45C6478D53C6318D4F8D2DCE0A14DF9EBD9D
S1136A556B3ADE1EBD787EC630A40027002C6318D92
S1136A65368D1D273A7A009F26E88614979F8D87S1
S1136A757A009E27D520DBC60D8D1CC60A8D1839D4
S1136A85780092408790009DE8E08DF9EDE1E08DB
S1136A95DF1E9C9539C62A17BD6D22SD6705398D44
S1136AAS68DF2C6438DF0BD7AAFDE36BD6AFFBDD5
S1136AB56A7CBD6B4F8DDEC6038DDCDE9C8D3BBDD4
S1136AC5674ABD7A84BD6805DC39BD697CA6029701
S1136AD5BA39BD67C28604E600271928B17C12A27D0
S1136AE51336C10D26078DAF324A36C6BA808DA75F
S1136AF5324D26E38D9F39BD6674DF86D6868D19A2
S1136B05D6878D1539D7877F00863F00DE86BD661B
S1136B15748DED30EE00313139375454545480CA5
S1136B25BD6A9C33C40F8D04BD6A9C39CB30C13A10
S1136B3525D2C90739BD6A9AC64CBD6A9CDE1E8DFB
S1136B45B6C620BD6A9CBD6A7C398D038D5739CE86
S1136B55240DA600815526110BE60027DC4F083799
S1136B65369D07324C335A26F639E60B271E3F0088
S1136B7536BD6A9A328D1630EE00313196BA36E654
S1136B850BD6A9C08324A26F5BD6A7C3936C6566C
S1136B95BD6A9C324C97877F0086DE86BD6AFCC63B
S1136BA520BD6A9C39B624002739BD6A9AC654BDEE
S1136BB56A9CF62400BD6B0ABD6A9AC653BD6A9CDD
S1136BC5CE24018D1FBD6A7CBD6A9AC652BD6A9CDE
S1136BD5CE240986D436E00BD6B1E08324A26F526
S1136BE5BD6A7C39D6BAC108250C37C6B8D0870895
S1136BF533C808.26F139A6B037C6304B3624B2C604
S1136C0531BD6A9C32335A26EF39CE02A086B1C6BD
S1136C151CA700034C5A26F9394FB72400B7240D90
S1136C25B7240E39FEFFF68C5050260486019671A80
S1136C35393BDFA3BD67C68DEBBD6704BD675F8122
S1136C451A27198D1A226F5979D7FB09C3FBBB6242B
S1136C550784B2B7240780B2D8DB7200D7E6CFFBD5E
S1136C656D35BD6C73812A27F6BD6D0420F7CE6D95
S1136C75725FA1000270A0808085CF16D7126F339D3
S1136C8508EE006E00DE1EBD787EBD6D5025298D86
S1136C951B24155F4D2702D690DE8E9690D43A40BE3
S1136CA51BA7B0BD6A52BE2C6913F1336961E9147
S1136CB59526B4961F91963239BD6D43971E8D7E98
S1136CC5971FDE1EBD65FDDF1E8DE124DB8D618111
S1136CD5202B7E6DCC8DAD39DE9C3FB08D5F97FB
S1136CE51E8D5B971F30EE0031319C1E2704C68232
S1136CF53F133FBBDEA335BD7A84BD6805DC39BDA2
S1136D05675F168D180120250BB85402706845F8102
S1136D155F27EC39810327C1810D26E339DB9DD734
S1136D259DC6B00D99CD79CBD665426D3BD67A13971
S1136D358DCD810D27FA398DF7812027FA398DFB0C
S1136D458D9C484848480368DE78D03331B39BD659E
S1136D554C250139C6913F138DA581302700813110
S1136D6527B6B12A26F200D398401C390A446D9BCF
S1136D75466DA94C6CBE436DBA566DD0526E5753D1
S1136D856E6B546E4C506EAF476EFABD6D43BD6865
S1136D95162500BD6D43BD6839250539BD677D399A
S1136DA5C6B3F13BD6D3581302F18131261886F4
S1136DB5FFBD677E39BD7AAFBD6D43918626088D9B
S1136DC5ED439187260139C6843F138655B7240D33
S1136DD5BD6ACFBD6D43971EBD6D43971FDE1EEDB6
S1136DE565FDDF1EDF997D001E265B8D0BE2557D6BA
S1136DF59AF12408230F7240E202DCE83F1D6BADF
S1136E05BD65B1D687D11F251EDE1E09D6BABD655F
S1136E15E4DE86DF1ECE240FDF8696879B1F971F31
S1136E259686991E971E0C394F36BD6D3C16323623
S1136E35CE02A0BD69E3A6004ADE1EBD69E3E700F4
S1136E45324C91BA26E339BD6ED3D79BF72400B3F64
S1136E55BB39BD6ACFCE240986D436BD6D43A70070
S1136E65B0B8324A26F539BD6ACFCE2401D6BAC108FF
S1136E75250C37C6B88D150833C00B26F139378D1A
S1136E85BB33C0085535C68B05A26FB3937BD6D3C8B
S1136E95813B0C270E81310D27B9814E8D2704C63B
```

```
S11365EA5843F1369B0335A26E339BD6ACFCE02A065
S11136EB596BA36BD6ED3E70008812A205324A26DD
S11136EC5F139324A2603862A39BD6C0F2023BD6D5C
S11136ED53C812A271CBD6D5336BD6D358120270F96
S11136EE5812A270BBD6D5333581B585B1B1639334C
S11136EF539C6913F138DD7C401B6240784021BB745
S11136F05240739BD67C6BD67B4BD66A4CE000DFDE
S11136F151EDEC44FD698C5F027B6C0108B0A20F68E
S11136F251B4ABD69E3A60097998616979EBD673BE4
S11136F354F36C606862D0BD675032919902C138B0AAD
S11136F453637BD6B1EC60A8629BD675033CB102B6D
S11136F55E8BD6736DE1E9699979FBD6AFCC6D286DF
S11136F6520BD6750860A979ADE1EBD787EC630A47A
S11136F750027015CBD6A9CBD6A85271567A009F2798
S11136F85077A009A26E220D5BD673B7A009E26C47F
S100F952097BD7A84BD68050C390D
S11136562DE86A600088DF86DE88A700088DF885A26B2
S11136572EF394FC16425054CC096420F78A30A70067
S11365824FC10A25054CCB0A20F78A30A701CA3038
S11136592E702395FA6008120251380030250810A88
S11365A224095818585B1B160802E90D390C39DFE9
S11365B28A968BD788D68ACE000908024035A2BD9
S11365C2030820F69B889788DF8639DF8A968B84B6
S11365D2079788968AD68B456445644569786D74C
S11365E28739DFE88CE0090DF865C5A27F496899BCD
S11365F28797879968899869786200EFDF86CE000054
S1136602DF889686444444446CE03E880209686B4B
S113661E20FCE000648D1796874444444CE000A8DFD
S11366228C968784D0FCE000180D03DE88394D271125
S11366320F8AD68BDB890789D68AD988D7884A2636
S11366642F139B6FFFF68150260332320D398DD32615
S11366652F839369686080BD69C12616B6FFF68150260B2
S113666620B96FFF7810126049612280049632840190D
S11366723239DF869687D686CE000008864C20082B2C
S113668203082DF78B648D0D9787DF8969898D0523
S11366929786DE8E6395F800A2B04CB1020F888BA9A
S11366A21B398D0EBD65CDDE867D00882701B0DF8E
S11366B22A398D03272939BD6973A6000B6DBDD823
S11366C2D19726156E600D198260F0BEBEOODFA5A67D
S11366D2B3BD6985EE00DF95390808A426DE39C68E
S11366E2303F13DF8A96189D1984DF27F896198470
S11366F20F364C97194F3630EE000131A6000847FA5
S1136702DE8A39368D1EB6E206840822247FBB7E2F6
S1136712073936963284818127078650B1FFF684
S1136722226E232399618901984DF270C8D2F811383
S1136732226F280298111260FA3986DB8DC686BA8D97
S113674C237C6038D043339C6324F5D270580B374
S113675258A26F839A6802F78DA908200F78D848100
S113676211B26F8FEFFFE6ED0BD67C2096F00088690
S113677208A708A100260382BDF7394F8D34DF8655
S1136782DF88C604DB88D788DE889F88355F363683
S11367923658A26FA9E88DE86A700085A26FA39BD9A
S113672A266542680D3696934A840F26023F14979315
S1136782339DE22268C2E0D0DF9139C6363F1357
S11367C2CE208139313F0D03FBDBD66542608E3F2C3F03
S11367D22784B6FFF6815D26023F14CE411A0926E9
S11367E2FD96E20796498407CE67FDBD69E3A60BC
S11367F2380EE0003131B7E206973639898D959581AD
S1136802859191BD6654260599636847F8A40B7E201
S113681206973639F008BD6973E60008A100270ECA
S113682208B0880885A26F530EE003131D3997A0D8
S1136823BEE003131DC393F008DB69738E600083691
S113664296A0A10083226D708A100270B20001080800
S1136852080085A26EA2009798D6A00D797CE5850470
S113668620CFF62604975807573637BD66A4333291
S113687220BE96978D9E250696988DBDF69793C9EC7
S113688208DFFFDFA0D8DEC25040787A897A1BD69298DD08
S113689232F2485FF810A250C818827030C20F18072
S113681A22D25F939CEFFFFDFA03696608BD6983217
S113681B220D8BD6929D03F2485FF8180827D0B810A99
S113681C224F480172248CE0OC20ED8D9325F93996ABCD0
S113682DB6D6816250596A1BD68393906A08D282430
S11368820E20BD6A98D352500BDD68162502978A39D68A
S11368F2A18D14240FDA18D21250BBD683925063F
S11136902A7A10C3997A13937C4F8C1F8260933484D
```

```
S11369124848488A0F0C39330D3937C40FC10F2642
S11369 22F633C4F910C393F193F1DC6900F7E2053C
S1136932C671F7E204D6A08D09252BC673F7E204CB
S1136942D6A137C4F0C1F02718545454548D0733D5
S1136952C40FC10F270FCE696917BD69E3E600F7BB
S1136962E2040C39330D393F065B4F666D70077FB8
S1136972 6FDEB8270139C6253F13DEA5270139C6C4
S1136982303F1343846006E4C49F1B3696A78156D6
S113699227088157270 43297E43932393637860378
S11369A22002860 5F69FF2C5802 70A014A26F509C8
S11369B226F0333239C6313F1301015A26FB39948A
S11369C29439439494979 4399A94979439 81882763
S11369D202818439DF869686919526049687919 65C
S11369E23936DFAC9BAD97AD24037C00AC32DEAC10
S11369F2393637DFAC1696AD1097AD24037A00AC66
S1006 6A02332 0EA50
S113620 5BD66A49FC68D10BD62770C398110270425
S1136215811A26029EC639BD6ACFF62400CE02A095
S1136225 6F03BD6574BD644C82640092A18DDDCE2F
S113623502A1BD659525E3BD6E4FCE24013F00BD8A
S1136245 62F7BD64336 3E202A030EE0031318DBCE8
S113625 5BD633125E5CE24093F00BD64E5BD644C2D
S1136265886 40B02A030EE0031318DA0BD651B257D
S1136275E439BD6ACF5F375CD71F7F001EBD6E0052
S113628 5332 55D37B6240D81 5526 05F1240E2509E0
S1136295DE1ED6BA8620BD64DE3337BD6389DE1EB5
S113 62A5DF86CE02A0DF88BD62FBD6BABD6562BDC9
S113 62B564366 4160 2A081102 725811A2719BD6347
S113 62C5A425D6CE02A0DF86D6BADE1EDF88BD653C
S113 62D5623FB933 5C2B9F33F1240E2308280013 36
S113 62E5F7240E2702C655F7240D39C629862 07ECD
S113 62F564DEDF86CE02A0DF88BD62F0D6BAC108AF
S1136305251037C6088D0BDE8608DF8633C00826C0
S1136315ED39DE86A6003 7C630483624 02C631DE9E
S1136325 88E7000 9DF8832335A26EB39DF86CE0248
S1136335A0DF88D6BAC1082 51237C6088D2025 35B1
S1136345DE8608DF8633C0082 6EB39372D102525 10
S1136355 33C0085 35CDE860C6800 5A26FA3937DEEA
S1136365 88A60008DF8813 90C2 70D81310D2708A8
S1136375814E0D27030D3339DE86690 0335A26DE37
S1136385 3FBBDC39CE02A15CBD6574CE6419BD67F3
S1136395 56CE02A08630A7004FA704BD675 639CE56
S113 63A502A0D6BA3F00A60 037CE63CFE60008A107
S113 63B500 27035A26F83330EE0031310D3933 30CE
S113 63C5EE003131085A26DC0C3912303132333 40F
S113 63D5 353637383 9434B4E4C4 85A4658464 94E 5C
S113 63E5 47455 2 50 52494E5 42053544152 54494EF4
S113 63F5 4 72 0 56454 354 4F52 3A2000 43 59434C4 590
S1136405532046 4F5 2 2 0 46494E4 74 55 2 0 52494E15
S113641 5543A2 00 000 0A5 3545 2 54545 22 454 499
S113642525 04453542056454354 4F52 200 0BD67CC
S113643 53B0EE00 3131DF86D6BACA5 0D7BBCE00F9
S113644 5BCDF88C604201 1BD673B30EE003131DF67
S1136455 86CE00BBDF88C605BD6562DE863F00BD0E
S1136465 64CE96BB843F97C008D4EDE8E 5FBD675F2D
S1136475BD67148 17F273181082732812 0271C813C
S11364 785 2 12 40E810 270881102704811A26DE5D30
S1136495 39A7B008 5CD1C026D4 2 0F48608BD670559
S11364A5A60 0BD67 0508 20EC 60 0BD67 0 50 95A2 A8C
S11364B5BC8622BD6705 20B 2DEBED6C08DFD6C012
S11364C5 86 08BD670 55A26F839DEBCC6 50A60 0 27DE
S11364D5 9 7BD67 0 5 0 5A2 6F539A70 00 85A26FA396B
S11364E5DF86CE02A0DF88C60 437DE86A60008DF75
S11364F5 868D0FDE88E7 00 08A70008DF88335A2653
S1136505E83936444444480 0 4163284 0 0F8B308173
S1136515 3A2502800 739DF86CE02A0DF88C6 04 3 709
S1136525DE88A6008D212510484848 4816 08A60082
S1136535 8D15251110BDF88DE86A70008DF86334 5
S11365454 5A26DC0C3933398030251081 0A250A8115
S113655 5112 50880 78110 24028C390D392E
S11368 4ABD66542 7037E6 205CE6 09CA60026 0139EC
S113685ADFAE363 03F1A32DEAE008DFAEEE003F1650
S113 686AEE0 03F 000D3F2485FF811024B0C3F1ED8
S113687A3F24850481102 5F6BD69CF2703 0C20F03F
```

```
S11360BA3332DEAEEEBBE7BBA7B13FBBDEAEB8B8FE
S11360B9A2BB9B124B1B22483E1248 9E224BBBBB695
S11360BAA248B97877FB086DE86BD6674DF8696871E
S11360BAB7B2A3CEB2ABC6BABD665427B37E62B5B3
S11360BCA3F2C3F1ABD3F2485FFBBD69CF27236FBB5C
S11360BDA2BB93F2485FFBD69CF271611124F484BFB4
S11360BEA68BB68BB68BB68BB3AABBA7BB3F1ABD2B2B
S11360BFAE1A6BB16C4BF84FB44444442785CBBA9D
S113610BA4A26FBBD6E4F39BD665427B37E61CACE4B
S113611A24B7C6B43FBA3F2C3F1ABD3F2485FFBDBE
S113612A69CF27E21124F43FBBA7BB2BEBBD6654D4
S113613A2656CEBBB3C6B37E611EBD66542687CE1C
S113614ABBC2C6B22BCE96C28B3BB7B2AB7FB2A13B
S113615ABD644C81616FB2ABB6B2ABB8B3B81B22422
S113616AE597C2BC39454E54455228B524F475276
S113617A414D2B5245AA45435428434F554E542BDD
S113618A4F5B54494F4E3AB896B38B3BB7B2AB7F12
S113619AB2A1BD644C8161B1B2AB8692AB8B3B8123
S11361AAB324E597B3BC39454E54455228544845C7
S11361BA2B564552494659284F5B54494F4E3AB8A9
S11361CAB6248788B3B8702A87FB2A1BD644C816158
S11361DAEDB2AB8682AB8B3B81B424E43FBBB72488
S11361EAB7BC39454E544552284C415354284655C8
S18E61FA534528F5B54494F4E3ABBCB
S11360B27E71547E72BC7E71AB7E787E77B27E18
S11361269CA7E69C47E69C17E748C7E72D37E7448
S11360B22DC7E65B17E65E47E66A67E69E37E69F3B5
S11360B327E65FD7E66747E675F7E67B57E699E7EF1
S18B60B4269BB7E67A17E761E96
S1B56BBBBBBBB9A
S9B3BBBBFC
```

// // //

The remaining circuitry illustrated in FIG. 3 is a read register 72 that is used to apply the bits of the shift register 14 (FIG. 1) to the data bus 30a of the programmer 30. Basically, the read register 72 sequentially receives bits from one shift register output. After eight bits have been stored in the read register 72, they are shifted out to the data bus 30a of the programmer 30 in parallel; and eight more bits are then stored in the same manner. The shift register is clocked at its CP input by a master oscillator (described below) and it shifts in either direction, depending upon the signal applied for its S inputs from circuitry in the controller portion of the controller/memory board.

The controller portion of the controller/memory board 32 is illustrated in FIG. 4. The controller portion includes a master oscillator 80 of conventional design generating a clock pulse output CP through an inverter 82. The master oscillator 80 also clocks a control counter 84 through an inverter 86, which, in turn, drives a second control counter 88. Basically, the counters 84,88 count to 48 and generate an eight-bit word corresponding thereto. The shift register 14 (FIG. 1) is clocked for the first 32 bits, and each of the 32 pins of the device under test 12 are applied to the shift register in sequence. At the end of 32 bits, a new signature or "vector" has been generated. Thereafter, for the next sixteen bits, the shift register 14 is not clocked; but the device under test is exercised to generate an output responsive to the new vector and this output is then stored by the system.

The control counter 88 clocks a vector counter 90, which counts the number of 48-bit periods in which a new vector is generated. When 128,000 vectors have been generated, the $Q_{14}$ output of the vector counter 90 goes high and halts further testing. At that time, the final vector in the shift register 14 will be a function of the response of the device under test 12 to all 128,000 vectors. The probability is exceedingly small that a correctly functioning device and an incorrectly functioning device will have the same vector at the end of the 128,000 vector test. This 128,000 vector test cycle can be extended to include additional cycles at the user's option without initializing the register 14 between cycles. It is to be understood that while a 128,000 vector test cycle is described herein, other cycles of sufficient length may be used.

The outputs of the control counters 84,88 are applied to the inputs of a test PROM 92 and a controller 94, which is a programmable logic array. The test PROM 92 and the controller 94 also receive the outputs of a mode register 96. Basically, the test PROM 92 provides the device under test with clock and enable signals for each of the sixteen bits in which the device is responding to a new vector. The particular combination of clock and enable signals for each of the sixteen bits, as well as their timing, is controlled by a four-bit word from the mode register 96. These clock and enable signals for the various outputs of the mode register 96 and counter 84 are as shown in the following truth table for the PROM 92 test:

| | Logic Pak Test Prom | | |
|---|---|---|---|
| Dec Addr. | Binary Data | Dec Addr. | Binary Data |
| 000 | 1 1 1 1 | 051 | 1 0 0 1 |
| 001 | 1 1 1 1 | 052 | 1 0 0 1 |
| 002 | 1 1 1 0 | 053 | 1 0 0 1 |
| 003 | 1 1 1 1 | 054 | 1 0 0 1 |
| 004 | 1 1 0 1 | 055 | 1 0 0 1 |
| 005 | 1 1 1 1 | 056 | 1 0 0 0 |
| 006 | 1 1 1 1 | 057 | 1 0 0 0 |
| 007 | 1 1 1 1 | 058 | 1 0 0 0 |
| 008 | 1 1 1 0 | 059 | 1 0 0 0 |
| 009 | 1 1 1 0 | 060 | 1 0 0 0 |
| 010 | 1 1 1 0 | 061 | 1 0 0 0 |

-continued

| Logic Pak Test Prom | | | | | Logic Pak Test Prom | | | |
|---|---|---|---|---|---|---|---|---|
| Dec Addr. | Binary Data | Dec Addr. | Binary Data | | Dec Addr. | Binary Data | Dec Addr. | Binary Data |
| 011 | 1 1 1 0 | 062 | 1 0 0 0 | | 141 | 1 1 1 0 | 192 | 1 1 1 1 |
| 012 | 1 1 0 0 | 063 | 1 0 0 0 | | 142 | 1 1 1 0 | 193 | 1 1 1 1 |
| 013 | 1 1 1 0 | 064 | 0 1 1 1 | | 143 | 1 1 1 0 | 194 | 1 1 1 1 |
| 014 | 1 1 1 0 | 065 | 0 1 1 1 | | 144 | 1 1 0 1 | 195 | 1 1 1 1 |
| 015 | 1 1 1 0 | 066 | 0 1 1 0 | | 145 | 1 1 0 1 | 196 | 1 1 1 1 |
| 016 | 1 1 0 1 | 067 | 0 1 1 1 | | 146 | 1 1 0 1 | 197 | 1 1 1 1 |
| 017 | 1 1 0 1 | 068 | 0 1 0 1 | | 147 | 1 1 0 1 | 198 | 1 1 1 1 |
| 018 | 1 1 0 0 | 069 | 0 1 1 1 | | 148 | 1 1 0 1 | 199 | 1 1 1 1 |
| 019 | 1 1 0 1 | 070 | 0 1 1 1 | | 149 | 1 1 0 1 | 200 | 1 1 1 0 |
| 020 | 1 1 0 1 | 071 | 0 1 1 1 | | 150 | 1 1 0 1 | 201 | 1 1 1 0 |
| 021 | 1 1 0 1 | 072 | 0 1 1 0 | | 151 | 1 1 0 1 | 202 | 1 1 1 0 |
| 022 | 1 1 0 1 | 073 | 0 1 1 0 | | 152 | 1 1 0 0 | 203 | 1 1 1 0 |
| 023 | 1 1 0 1 | 074 | 0 1 1 0 | | 204 | 1 1 1 1 | | |
| 024 | 1 1 0 0 | 075 | 0 1 1 0 | | 205 | 1 1 1 1 | | |
| 025 | 1 1 0 0 | 076 | 0 1 0 0 | | 206 | 1 1 1 1 | | |
| 026 | 1 1 0 0 | 077 | 0 1 1 0 | | 207 | 1 1 1 1 | | |
| 027 | 1 1 0 0 | 078 | 0 1 1 0 | | 208 | 1 1 0 1 | | |
| 028 | 1 1 0 0 | 079 | 0 1 1 0 | | 209 | 1 1 0 1 | | |
| 029 | 1 1 0 0 | 080 | 1 1 1 1 | | 210 | 1 1 0 1 | | |
| 030 | 1 1 0 0 | 081 | 0 1 0 1 | | 211 | 1 1 0 1 | | |
| 031 | 1 1 0 0 | 082 | 0 1 0 0 | | 212 | 1 1 0 1 | | |
| 032 | 1 0 1 1 | 083 | 0 1 0 1 | | 213 | 1 1 0 1 | | |
| 033 | 1 0 1 1 | 084 | 0 1 0 1 | | 214 | 1 1 0 1 | | |
| 034 | 1 0 1 0 | 085 | 0 1 0 1 | | 215 | 1 1 0 1 | | |
| 035 | 1 0 1 1 | 086 | 0 1 0 1 | | 216 | 1 1 0 0 | | |
| 036 | 1 0 0 1 | 087 | 0 1 0 1 | | 217 | 1 1 0 0 | | |
| 037 | 1 0 1 1 | 088 | 0 1 0 0 | | 218 | 1 1 0 0 | | |
| 038 | 1 0 1 1 | 089 | 0 1 0 0 | | 219 | 1 1 0 0 | | |
| 039 | 1 0 1 1 | 090 | 0 1 0 0 | | 220 | 1 1 0 0 | | |
| 040 | 1 0 1 0 | 091 | 0 1 0 0 | | 221 | 1 1 0 0 | | |
| 041 | 1 1 1 1 | 092 | 0 1 0 0 | | 222 | 1 1 0 0 | | |
| 042 | 1 0 1 0 | 093 | 0 1 0 0 | | 223 | 1 1 0 0 | | |
| 043 | 1 0 1 0 | 094 | 0 1 0 0 | | 224 | 1 1 1 1 | | |
| 044 | 1 0 0 0 | 095 | 0 1 0 0 | | 225 | 1 1 1 1 | | |
| 045 | 1 0 1 0 | 096 | 0 0 1 1 | | 226 | 1 1 1 1 | | |
| 046 | 1 0 1 0 | 097 | 0 0 1 1 | | 227 | 1 1 1 1 | | |
| 047 | 1 0 1 0 | 098 | 0 0 1 0 | | 228 | 1 1 1 1 | | |
| 048 | 1 0 0 1 | 099 | 0 0 1 1 | | 229 | 1 1 1 1 | | |
| 049 | 1 0 0 1 | 100 | 0 0 0 1 | | 230 | 1 1 1 1 | | |
| 050 | 1 0 0 0 | 101 | 0 0 1 1 | | 231 | 1 1 1 1 | | |
| 102 | 0 0 1 1 | 153 | 1 1 0 0 | | 232 | 1 1 1 0 | | |
| 103 | 0 0 1 1 | 154 | 1 1 0 0 | | 233 | 1 1 1 0 | | |
| 104 | 0 0 1 0 | 155 | 1 1 0 0 | | 234 | 1 1 1 0 | | |
| 105 | 0 0 1 0 | 156 | 1 1 0 0 | | 235 | 1 1 1 0 | | |
| 106 | 0 0 1 0 | 157 | 1 1 0 0 | | 236 | 1 1 1 0 | | |
| 107 | 0 0 1 0 | 158 | 1 1 0 0 | | 237 | 1 1 1 0 | | |
| 108 | 0 0 0 0 | 159 | 1 1 0 0 | | 238 | 1 1 1 0 | | |
| 109 | 0 0 1 0 | 160 | 1 1 1 1 | | 239 | 1 1 1 0 | | |
| 110 | 0 0 1 0 | 161 | 1 1 1 1 | | 240 | 1 1 0 1 | | |
| 111 | 0 0 1 0 | 162 | 1 1 1 1 | | 241 | 1 1 0 1 | | |
| 112 | 0 0 0 1 | 163 | 1 1 1 1 | | 242 | 1 1 0 1 | | |
| 113 | 0 0 0 1 | 164 | 1 1 1 1 | | 243 | 1 1 0 1 | | |
| 114 | 0 0 0 0 | 165 | 1 1 1 1 | | 244 | 1 1 0 1 | | |
| 115 | 0 0 0 1 | 166 | 1 1 1 1 | | 245 | 1 1 0 1 | | |
| 116 | 0 0 0 1 | 167 | 1 1 1 1 | | 246 | 1 1 0 1 | | |
| 117 | 0 0 0 1 | 168 | 1 1 1 0 | | 247 | 1 1 0 1 | | |
| 118 | 0 0 0 1 | 169 | 1 1 1 0 | | 248 | 1 1 0 0 | | |
| 119 | 0 0 0 1 | 170 | 1 1 1 0 | | 249 | 1 1 0 0 | | |
| 120 | 0 0 0 0 | 171 | 1 1 1 0 | | 250 | 1 1 0 0 | | |
| 121 | 0 0 0 0 | 172 | 1 1 1 0 | | 251 | 1 1 0 0 | | |
| 122 | 0 0 0 0 | 173 | 1 1 1 0 | | 252 | 1 1 0 0 | | |
| 123 | 0 0 0 0 | 174 | 1 1 1 0 | | 253 | 1 1 1 1 | | |
| 124 | 0 0 0 0 | 175 | 1 1 1 0 | | 254 | 1 1 1 1 | | |
| 125 | 0 0 0 0 | 176 | 1 1 0 1 | | 255 | 1 1 1 1 | | |
| 126 | 0 0 0 0 | 177 | 1 1 0 1 | | | | | |
| 127 | 0 0 0 0 | 178 | 1 1 0 1 | | | | | |
| 128 | 1 1 1 1 | 179 | 1 1 0 1 | | | | | |
| 129 | 1 1 1 1 | 180 | 1 1 0 1 | | | | | |
| 130 | 1 1 1 1 | 181 | 1 1 0 1 | | | | | |
| 131 | 1 1 1 1 | 182 | 1 1 0 1 | | | | | |
| 132 | 1 1 1 1 | 183 | 1 1 0 1 | | | | | |
| 133 | 1 1 1 1 | 184 | 1 1 0 0 | | | | | |
| 134 | 1 1 1 1 | 185 | 1 1 0 0 | | | | | |
| 135 | 1 1 1 1 | 186 | 1 1 0 0 | | | | | |
| 136 | 1 1 1 0 | 187 | 1 1 0 0 | | | | | |
| 137 | 1 1 1 0 | 188 | 1 1 0 0 | | | | | |
| 138 | 1 1 1 0 | 189 | 1 1 0 0 | | | | | |
| 139 | 1 1 1 0 | 190 | 1 1 0 0 | | | | | |
| 140 | 1 1 1 0 | 191 | 1 1 0 0 | | | | | |

The mode register 96 is controlled by the programming in the PROM 70 (FIG. 3) and the particular address from the programmer 30 (FIG. 1). In this manner, the system is, in effect, adapted to the particular characteristics of programmable logic devices. The mode register 96 is clocked by a $\overline{C6}$ bit from a secondary decoder in the wave form generator 34, as explained in greater detail below. The output of the test PROM 92 is clocked into a control register 100 by the master oscillator 80 through a synchronization register 85.

The controller 94 provides certain control signals throughout a 128,000-vector test. It receives a TEST input bit from the control register 100 which is high for the sixteen clocks that the device under test 12 is responding to a new vector. It also receives a RUN input bit from the control register 100 that is high at all times until 128,000 vectors in a test have been generated. At and checking the characteristics of the fuses. It also supplies these voltages for testing the results of the programming by verifying the blown fuses, and it supplies power to the programmable logic device while being tested. Various control voltages are generated by a secondary decoder 200, which is enabled by the $\overline{C1}$ bit from the primary decoder latch 56 (FIG. 3) and clocked by the master oscillator 80 in the controller portion of the controller/memory board 32, as illustrated in FIG. 4. The secondary decoder 200 may also be enabled by the A4' bit through an inverter 202. The particular outputs generated by the secondary decoder 200 are selected by the A1'-A3' inputs to the decoder 200, with the decoder 200 generating bits at its $Y_0-Y_7$ outputs in accordance therewith. The operation of the secondary decoder 200 is synchronized to clock $\overline{V02}$ of the programmer 30. The values for the analog voltages are indicated by an eight-bit word on the data bus 30a and applied to a data latch 204, triggered by the programmer clock bit $\overline{V02}$ through an inverter 206. The outputs of the data latch 204 are pulled high through pull-up resistors 208 and are applied to the inputs of four digital-to-analog converters 210–216, which are individually enabled by respective outputs from the secondary decoder 200. These outputs are held high through respective pull-up resistors 218–224. The generated analog voltages of the converters 210–216 are connected to respective operational amplifiers 226–232, and the outputs of the operational amplifiers are applied through respective resistors 234–240 to respective amplifiers 242–248.

The amplifier 242 drives the gate of a field-effect transistor 250 which has a pair of current-sensing resistors 252,254 connected between a power supply and the drain. The source of the field-effect transistor 20 generates the power supply voltage VCC for the device under test through diode 256, and this voltage is fed back to amplifier 242 through a zener diode 258, a diode 260, a potentiometer 262, and a resistor 264. Adjustment of the potentiometer 262 controls the degree of negative feedback provided to the amplifier 242 and hence the magnitude of the power supply voltage VCC. The power supply voltage VCC is also low-pass filtered by a capacitor 268.

The voltage across the resistor 252 is indicative of the current through the field-effect transistor 250, and is applied through a resistor 270 to the base of a transistor 272. When the current-induced voltage across the resistor 252 exceeds a predetermined voltage (in the illustrated embodiment, about 0.6 of a volt), the transistor 272 becomes conductive and current is applied through a resistor 274 to the base of a transistor 276, which is normally held low through a resistor 278 and filtered by a capacitor 280. As explained below, the transistor 276 becomes conductive in the event of certain abnormal conditions in order to reset various circuits as explained below.

The current flowing through the field-effect transistor 250 is also indicated by the voltage across the series combination of resistors 252 and 254. This voltage is applied to the base of a transistor 282 through a resistor 284. Insofar as the voltage across the series combination of the resistors 252 and 254 will always be greater than the voltage across the resistor 252 alone, the transistor 282 can be expected to turn on before the transistor 272. Thus, the transistor 282, which is connected to the base of transistor 276 through a resistor 286 and a diode 288, will normally turn on the transistor 276 before it is turned on by transistor 272. However, the transistor 282 is prevented from turning on the transistor 276 by clamping the anode of the diode 288 to the voltage drop across one diode on occurrence of a low output of an inverter 290, which is connected to the anode of diode 288 through a diode 292. Consequently, the transistor 276 is turned on by the transistor 272 after a sufficiently large current is flowing through the field-effect transistor 250. When the output of the inverter 290 is high, the transistor 282 will conduct at a relatively low current, thereby turning on the transistor 276. The inverter 290 is controlled by the outputs of a control register 296, which is clocked by the secondary decoder 200 and controlled by the output of the data latch 204.

In a manner similar to the circuit connected to the amplifier 242, the amplifier 244 drives the base of a transistor 300, which outputs at its emitter a chip-enable supply (CE SUPPLY) voltage. This CE SUPPLY voltage is fed back to the inverting input of the amplifier 244 through a diode 302, a potentiometer 304, and the parallel combination of a resistor 306 and a capacitor 308 which acts as a low-pass filter. The cathode of diode 302 is biased low through a resistor 310. The magnitude of the CE SUPPLY voltage may thus be adjusted by adjusting the potentiometer 304. The current through the transistor 300 is measured by a current-sensing circuit, indicated generally by reference numeral 311, which operates in the same manner as the current-sensing circuit for the field-effect transistor 250 described below. This circuit also turns on the transistor 276 when either of two current thresholds are exceeded, depending upon the condition of an inverter 312 which is controlled by the control register 296. Similarly, the output of the amplifier 246 generates a BIT SUPPLY voltage and turns on the transistor 276 through a current-sensing circuit 316 identical to the current-sensing circuit 311.

The collector of transistor 276, which is biased high through a resistor 320, goes low when the selected high or low threshold is exceeded for any of the current-sensing circuits described above, and the transistor turns on. When the collector of transistor 276 goes low, a reset memory flip-flop 324 is cleared, thereby causing the flip-flop 324 to generate a high at its $\overline{Q}$ output. This high turns on a transistor 326 through a resistor 328, thereby discharging a capacitor 330 and pulling a reference voltage (VREF) applied to the digital-to-analog converters 210 216 to zero, resulting in amplifiers 242248 being powered down. This reduced voltage reference causes the COMPARISON REFERENCE (COMP REF) output voltage generated by amplifier 248 to also be reset to zero. Thereafter, a high is applied to the data input of the flip-flop 324 from the data latch 204, and the clock input is released by the secondary decoder 200 and pulled high through a resistor 334. The $\overline{Q}$ output of the flip-flop 324 then goes low, turning off the transistor 326 and allowing the capacitor 330 to charge through a resistor 336, thereby restoring the original reference voltage to the digital-to-analog converter 210 216. This reference voltage may be adjusted by adjusting potentiometer 338, which is connected to a voltage reference zener diode 340. The flip-flop 324 also generates a RESET signal through an inverter 342.

Figure 5:
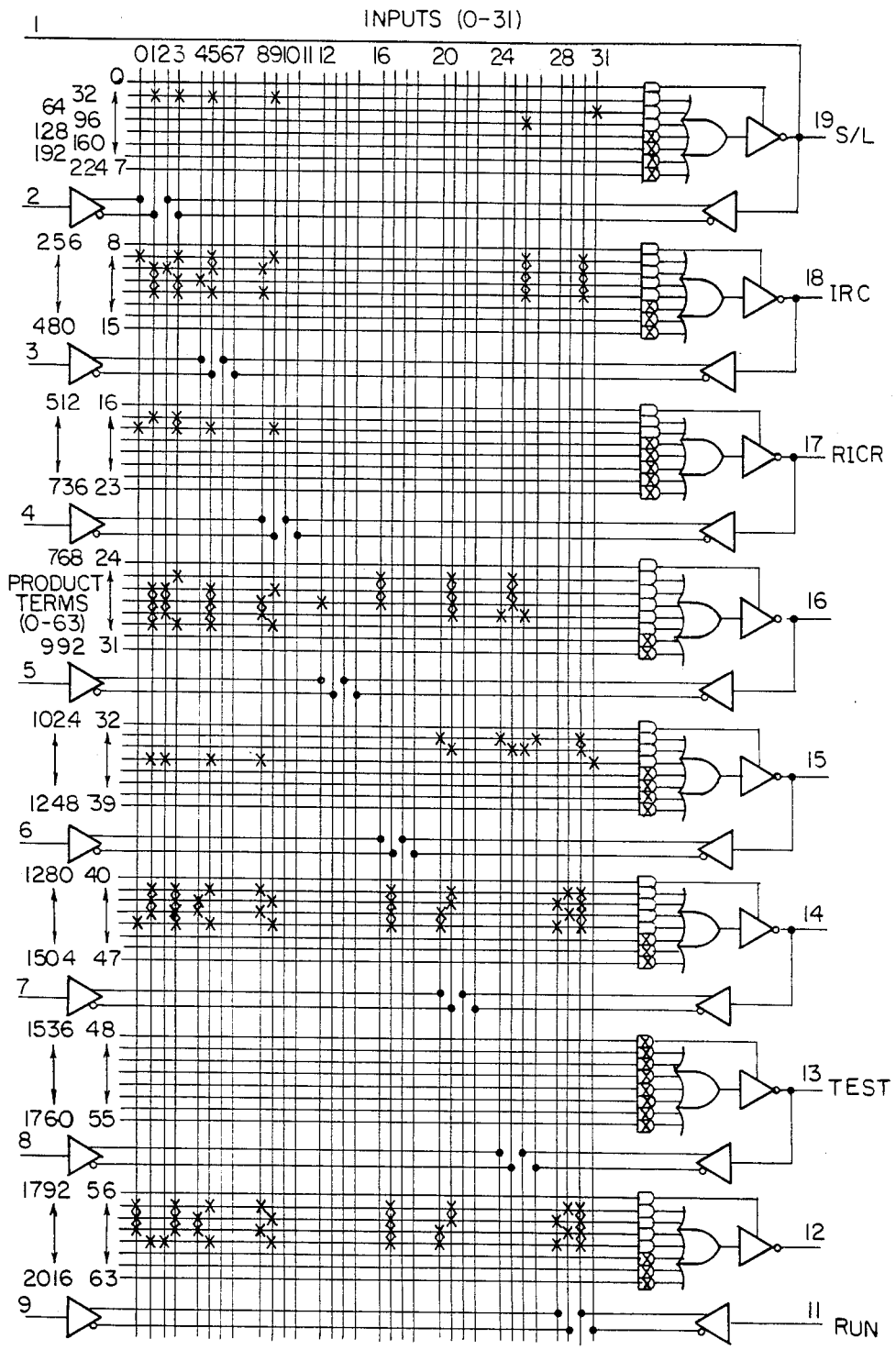
FIG. 5 is a logic diagram for a programmable logic device used in the controller subsystem of FIG. 4 to provide various control signals for the functional testing system.

The flip-flop 324 is also cleared by transistor 344 and the RESET signal generated when power is initially applied to the system. When a power is initially applied, the clear (CL) input of a flip-flop 346 is initially held low through a capacitor 348, thereby causing the $\overline{Q}$ that time, the RUN bit goes low, thereby clearing the counters 84,88,90 in preparation for a new test. The other inputs to the controller 94 are a four-bit word from the mode register 96 indicative of certain characteristics of the test to be performed and a five-bit word from the counters 84,88,90. The controller 94 is a programmable logic device programmed as shown in the logic diagram of FIG. 5. The controller 94 is a PAL, part no. DMPAL 16L8CP made by National Semiconductor, Santa Clara, Calif.

During the sixteen-clock test period for the final vector, the TEST input and the $Q_{14}$ output of vector counter 90 are both high. These two high bits are applied to a status AND gate 110, thereby generating a high as a STATUS signal that is applied to the data bus 30a of the programmer 30 (as explained below) in order to inform the programmer 30 that the test is completed.

The TEST bit is also inverted by an inverter 112 and applied to a chip-enable AND gate 114, which is connected to the test PROM 92. The AND gate 114 also receives an input from an AND gate 116, which receives two bits from the mode register 96. In certain modes, the output of the AND gate 114 will thus be high during the sixteen-bit period that the device under test 12 is responding to a new vector. Certain programmable logic devices have dedicated enable and clock pins; and if these pins were randomly driven, the device would be randomly enabled and clocked. Where it is desired that the device be continuously enabled and periodically clocked during the sixteen-bit test period, a mode is selected through the programmer 30 that causes the AND gate 114 to go high during the sixteen-bit test period. This high output causes the test PROM 92 to generate output bits $\overline{CP1}$, $\overline{CP2}$, $\overline{CE1}$, and $\overline{CE2}$ through the control register 100 and four respective inverters 118 which each have their outputs pulled high through pull-up resistors 120. As explained in greater detail below, these outputs allow certain pins of the device under test 12 to assume predetermined logic levels without regard to the levels applied to those pins by the shift register 14.

The controller 94 also generates an input register control (IRC) bit for causing the shift register 14 to respond to a clock pulse by either loading data into the shift register 14 in parallel or shifting each bit of the register. Similarly, the controller 94 also generates a shift/load (S/L) bit for performing the same function in a shift register for recording the response of the device under test 12 to a new vector, as explained in greater detail below. A RCIR bit is also generated by the controller 94 and applied to the shift register 14. When high, the RCIR bit disables the exclusive OR gate 18 (see FIG. 1) so that data recirculates in the shift register 14 without change. In this manner, data is transferred from the shift register 14 to the read register 72 (FIG. 3) which applied the data to the data bus of the programmer 30.

Finally, the controller 94 generates through a pair of inverters 122,124 shift signals for the read register 72 (FIG. 3), as mentioned above, and an input to the control register 100 through an inverter 126.

The test begins with the $\overline{C6}$ input to the counter 84, a flip-flop, goes high. On the next leading edge of the clock pulse CP from master oscillator 80, this high is clocked to the corresponding output of the control register 100, thereby clearing the control counters 84,88 and the vector counter 90 through an inverter 130, and making the RUN input to the controller 94 high. Thereafter, the control counters 84,88 continue incrementing, causing the test PROM 92 and controller 94 to generate appropriate outputs until the vector counter 90 reaches 128,000, at which time it applies a low to the status AND gate 110.

Figure 6A:
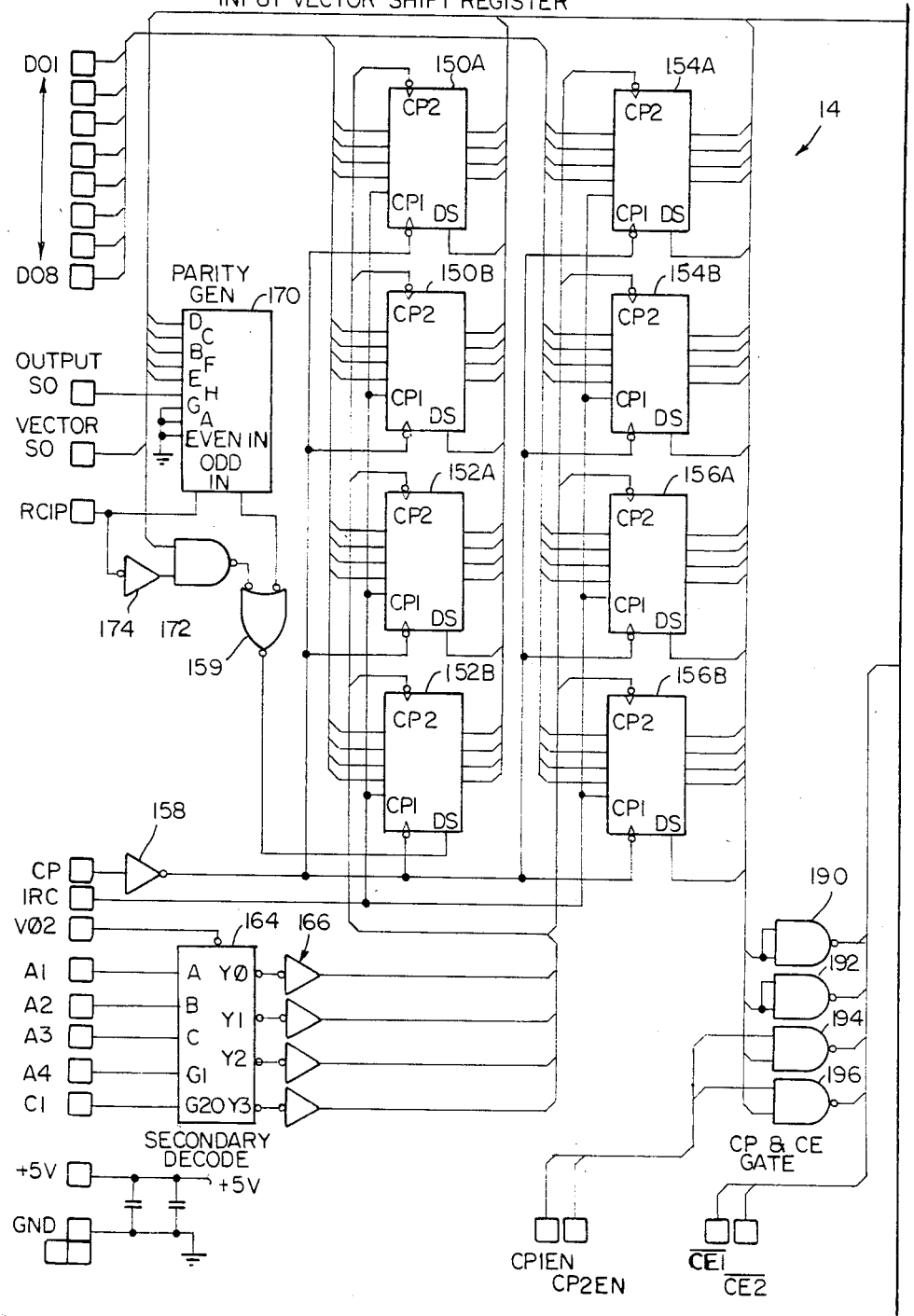
FIG. 6, comprised of FIGS. 6A and 6B, is a schematic of the sink driver subsystem of the functional testing system that contains a shift register and exclusive OR-gate creating the test vector and circuitry for applying the test vector to the device under test through isolation elements.

The sink driver 38, as illustrated in FIG. 6, includes the shift register 14 (FIG. 1) in the form of a series of eight four-bit shift registers 150–156 arranged in correspondingly numbered pairs (indicated by the letters "A" and "B") to generate eight bits. The shift registers 150–156 are all clocked at the same time by the clock pulse CP through an inverter 158. The shift registers 150–156 may operate in either of two modes, a shift mode or a load mode. In the shift mode, selected by the IRC input being made high, data from an AND gate 159 is applied to the DS input of the shift register 152B and is sequentially shifted through its four stages before being shifted to shift register 152A and each of the other shift registers in sequence. In the load mode, selected by the IRC input being made low, each pair of the shift registers are selected by a secondary decoder 164 through inverters 166. At the clock pulse CP, data on the data bus 30a of the programmer 30 is shifted into the selected pair of shift registers, with the four low-order bits being shifted into the "A" shift registers and the high-order bits being shifted into the "B" shift registers. The initial state of the shift registers 150–156 can thus be preset prior to a test.

In the shift mode, the outputs of the shift registers 150–156 are applied to the device under test 12, as explained hereinafter, and each pin outputting the device's response to the vector is sequentially applied to another input of a parity generator 170 from the OUTPUT S0 line: the parity generator 170 functions as the exclusive OR gate 18 (FIG. 1) when the RCIR input is low. Five of its inputs are connected to the shift registers 150–156 stages 32, 23, 3, 2, 1 and its output is fed back to the input of the shift register 152B stage 32 through the NAND gate 159 in order to maximize the pseudorandom nature of the test vector. When the RCIR input goes high, a NAND gate 172 is disabled through an inverter 174, and the AND gate 159 functions as an inverter. In a recirculating mode, data merely recirculates through the shift register, allowing the data to be read by the read register 72 (FIG. 3) via the VECTOR S0 output. The outputs of the shift registers 150–156 are applied to respective inverters 180, which are, in turn, connected to the device under test 12 through respective resistors 182. Pull-up resistors 184 are provided since the logic "1" condition of the inverters 180 is an open circuit. Although most of the outputs of the shift registers 150–156 are applied directly to their respective drivers 180, four of these outputs are applied to four NAND gates 190–196. The NAND gates 190–192 act as inverters and apply respective bits of the shift register 14 to the chip-enable pins of the device under test 12. It will be noted, however, that the chip-enable pins may be overridden by the $\overline{CE1}$ and $\overline{CE2}$ inputs which are generated by the test PROM 92 (FIG. 4) in order to keep the device under test 12 continuously enabled. The NAND gates 194,196 gate inverted bits of the shift register 14 when they are enabled by the CP1EN and CP2EN inputs, respectively. When they are not enabled, the CP1 and CP2 inputs are routed to the clock pins of the device under test 12.

Figure 7B:
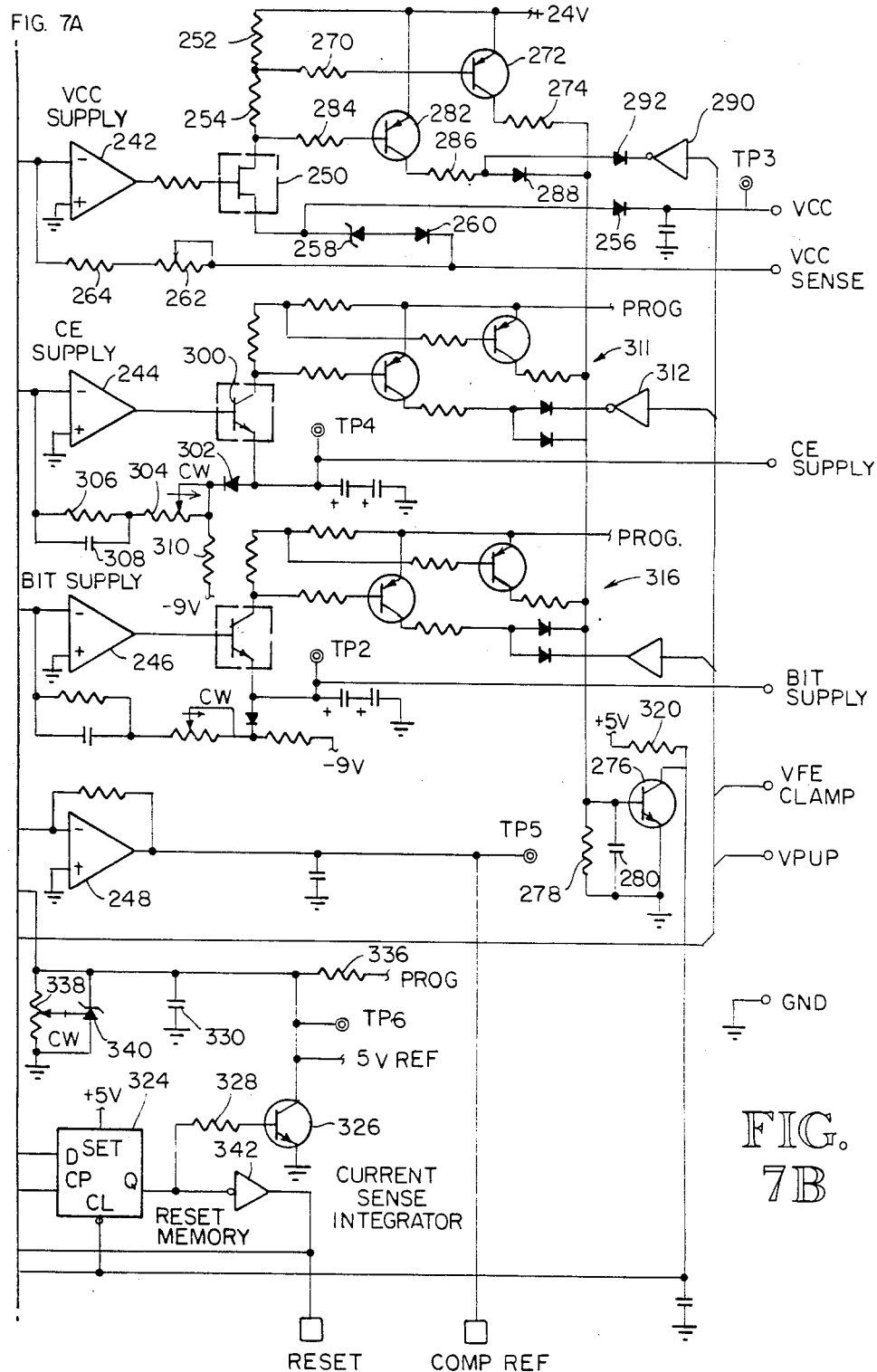
FIG. 7, comprised of FIGS. 7A and 7B, is a schematic of the waveform generator subsystem of the functional testing system which generates various analog voltages that are indirectly applied to the device under test for programming the device.

The waveform generator 34, as illustrated in FIG. 7, provides various analog voltages for programming the programmable logic device by burning in internal fuses output of the flip-flop 346 to go high. This high is applied through a resistor 350 to the base of the transistor 344, thereby pulling the clear (CL) input to the flip-flop 324 low and resetting it. The capacitor 348 then begins charging through a resistor 352. When the capacitor 348 charges to a voltage exceeding the threshold voltage of the CL input of the flip-flop 346, the output of the flip-flop 346 is clocked low on the next clock pulse $\overline{V02}$, thus turning off the transistor 344 and removing the low from the CL input of the flipflop 324. In the event that power is lost for even a short period of time, the capacitor 348 is quickly discharged through a diode 354, thereby once again resetting the flipflop 324 for a short period of time until the capacitor 348 is once again charged.

Figure 8:
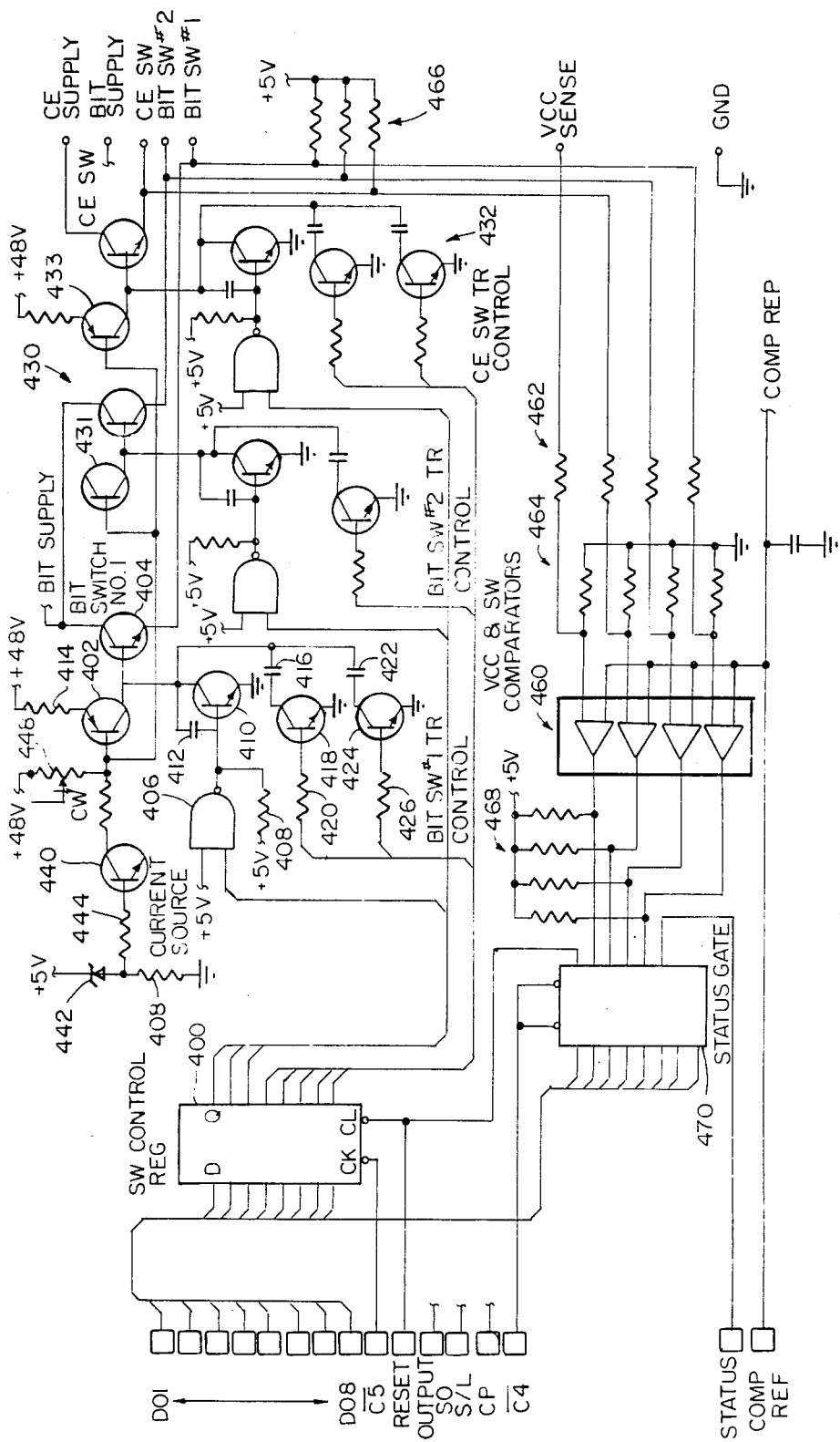
FIG. 8 is a schematic of the rise-time subsystem of the functional testing system for applying the analog voltages generated by the wave form generator of FIG. 8 to the device under test with a predetermined rise time.

The rise-time circuit 36, as illustrated in FIG. 8, provides output waveforms having predetermined rise times for programming the device under test 12. The rise times for these waveforms are controlled by an eight-bit word on the data bus 30a. The eight-bit word is applied to a switch control register 400 cleared by the reset from the flip-flop 324 (FIG. 4) and clocked by the $\overline{C5}$ bit of the secondary decoder 200 (FIG. 6). As explained in greater detail hereinafter, the switch control register 400 generates outputs to control the rise times of the CE SUPPLY and BIT SUPPLY outputs from the waveform generator of FIG. 7.

The first switch circuit is formed by a pair of transistors 402 and 404 powered by the BIT SUPPLY signal. These transistors 402,404 output a bit switch number one (BIT SW #1) signal having a rise time selected from one of three values. The switch is turned off by a low applied to a NAND gate 406, which allows current to flow through a resistor 408 to turn on a transistor 410. The transistor 410 then pulls the collector of the transistor 402 to ground, causing the emitter of transistor 404 to follow. When the input to the NAND gate 406 goes high, the base of the transistor 410 goes low, thereby turning off transistor 410 and allowing a capacitor 412 to charge with a current in proportion to the voltage across a resistor 414. The transistor 402 thus acts as a current source for the capacitor 412 so the rise time of the BIT SW #1 signal is proportionate to the time constant of the combination of resistor 414 and capacitor 412. The time constant can vary by allowing a capacitor 416 to also charge, in which case a transistor 418 is turned on by applying a high output of the switch control register 400 through a resistor 420 to the base of the transistor 418. Similarly, a capacitor 422 may be placed in parallel with the capacitors 412,416 by turning on a transistor 424 by applying a high output of the switch control register 400 through a resistor 426 to the base of the transistor 424.

In a similar manner, a second switch circuit, indicated generally by reference numeral 430, outputs a bit switch number two (BIT SW #2) signal, except that the rise time may be only one of two values, instead of three (as with the BIT SW #1 described above). Finally, a third switch circuit, indicated generally by reference numeral 432, outputs a chip-enable switch (CE SW) signal having a rise time that may be selected as one of three values. The CE SW signal is generated from the CE SUPPLY output of the waveform generator (FIG. 7).

Voltage cutout circuitry is provided to disable all three of the switch circuits described above whenever power is reduced or removed from the testing device 10. Accordingly, the power supply voltage is applied to a transistor 440 through a voltage dropping zener diode 442 and resistor 444. When the power supply voltage drops, the base of the transistor 440 is pulled to ground through a resistor 446, thereby cutting off transistor 440 and allowing the bases of the transistor 402 and a pair of transistors 431 and 433 to be pulled to the power supply voltage through a potentiometer 448. The transistors 402,431,433 are thus turned off, thereby allowing the bases of their respective emitter follower output transistors to fall to zero volts. When the power supply voltage is sufficient to turn on the transistor 440, the bases of the transistors 402,431,433 are turned on when sufficient current is flowing through resistor 450, connecting the transistor 440 to the potentiometer 448. The voltage cutout circuitry described above is provided to remove power from the device under test 12 during a programming operation if the power supply voltage of the testing device 10 starts to drop. Without such circuitry, the fuses of the device under test 12 could be blown at random, thereby destroying the usefulness of the device.

The CE SW BIT #1 and BIT SW #2 signals, as well as a VCC SENSE signal from the circuitry generating the power supply voltage VCC (FIG. 7), are monitored by respective comparators, indicated generally by reference numeral 460. Accordingly, each of these monitored signals is connected to respective pairs of voltage divider resistors, indicated generally by reference numerals 462,464, the center of each pair being connected to the positive input of the respective comparator 460. A positive voltage applied through pull-up resistors, indicated generally by reference numeral 466, prevents the voltage applied to any of the voltage divider resistors 462,464 from being pulled below the power supply voltage. The negative inputs of the comparators 460 are connected to the comparison reference (COMP REF) voltage that is generated by the waveform generator 34 (FIG. 7). Thus, the output of each comparator 460 indicates the logic level of the respective signal that it monitors. The outputs of comparators 460 are biased high through pull-up resistors, indicated generally by reference numeral 468, and are applied to a status gate 470 that is enabled by the $\overline{C4}$ bit from the secondary decoder 58 (FIG. 3). The status gate 470 also receives the STATUS signal from the status AND gate 110 (FIG. 4), which indicates that 128,000 test vectors have been generated and the test is now completed. All of the outputs of the status gate 470 are applied to the data bus 30a of the programmer 30.

It will be remembered that the test vector is applied to the device under test 12 by the sink driver 38 (FIG. 7). Basically, as described in greater detail above, the test vector is generated by the shift register 14. Each bit of the shift register is applied to the device under test 12 through the resistor 16 or other isolation element. Thus, pins of the device under test 12 that are inputs will have the same logic level as the corresponding bit output by the shift register 14. In contrast, pins of the device under test 12 that are outputs will have a logic level determined by the device under test rather than the corresponding bit of the shift register 14.

Figure 9:
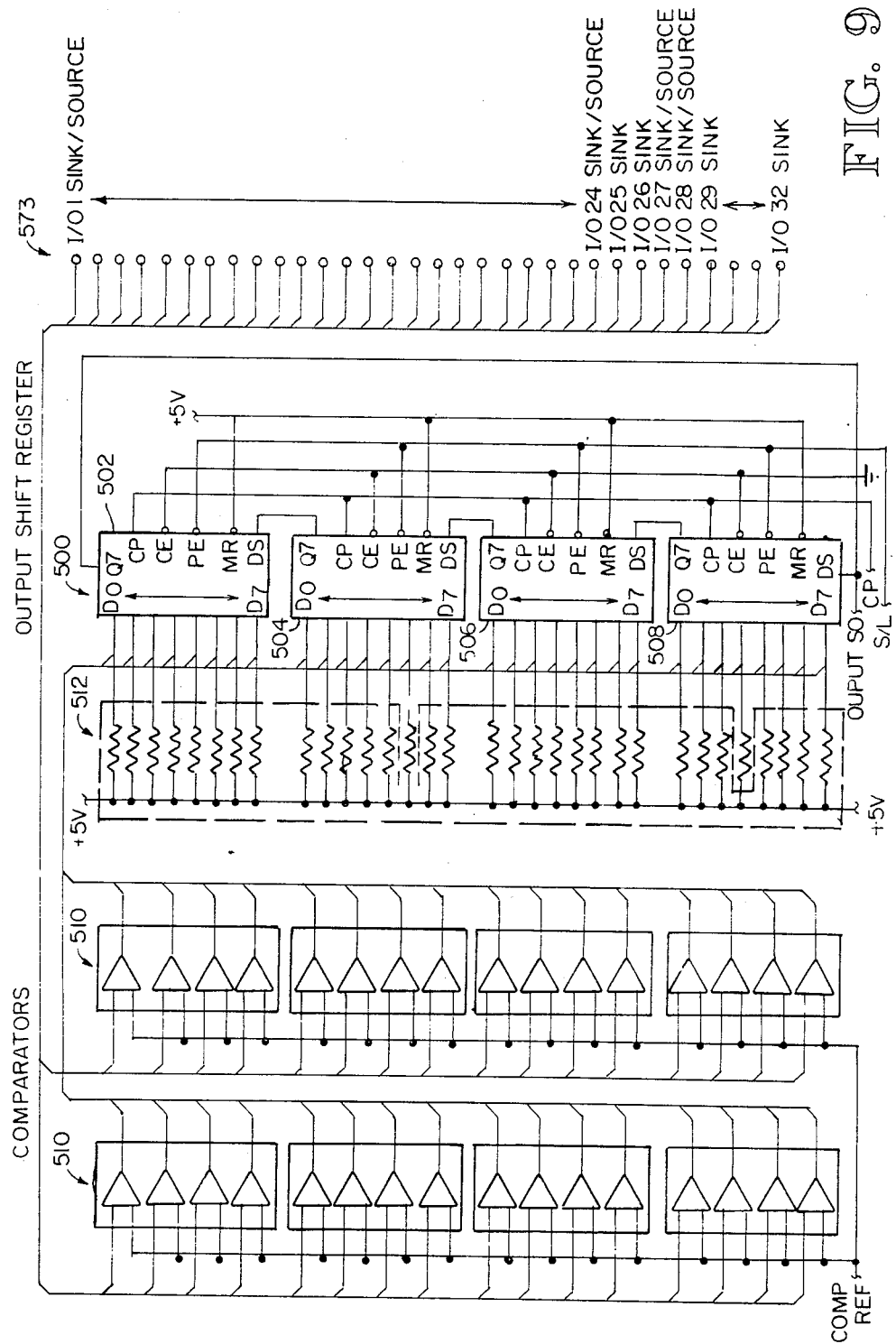
FIG. 9 is a schematic of the comparator subsystem of the functional testing system that determines the logic level on each contact pin of the device under test as it responds to the test vector and stores the results of each comparison in a shift register.

In order to determine the logic levels on the pins of the device under test 12, the logic levels on the pins are stored by a 32-bit shift register 500 in the rise-time/comparator 36, as illustrated in FIG. 9. The shift register 500 consists of four eight-bit stages 502–508. Each of the 32 pins of the device under test 12 is applied to the respective positive inputs of comparators, indicated generally by reference numeral 510. The negative inputs of the comparators 510 are connected to the comparison reference (COMP REF) voltage generated by the waveform generator 34 (FIG. 7). The amplitude of the COMP REF voltage is determined by the digital-to-analog converter 216 (FIG. 7), which is, in turn, controlled by the programmer 30. The programmer 30 thus determines the logic level, differentiating a logic "0" from a logic "1." The outputs of the comparator 510 are each applied to an input of a respective bit of the 32-bit shift register 500, all of which are biased high through respective pull-up resistors, indicated generally by reference numeral 512.

As described above, after a vector has been created, the device under test 12 is exercised for sixteen bits, during which time the response of the device under test 12 to the vector is present on the pins of the device under test. The shift load (S/L) bit generated by the controller 94 (FIG. 4) is then made low, and the shift register 500 is clocked by the clock pulse output CP from the master oscillator 80 (FIG. 4), thereby causing the comparison of the voltages on all 32 pins of the device under test 12 with the comparison threshold voltage to be written into the shift register 500 in parallel.

A new test vector is then generated by the S/L bit going high and then clocking the shift register 500 with 32 clock pulses CP from the master oscillator 80. Each bit of the shift register 500 is then sequentially presented to the OUTPUT SO line and used to perform two functions. First, the bits are applied to the parity generator 170 (FIG. 6b), which as described above, acts as an exclusive OR gate. Thus, the shift register 500 applies a logic level corresponding to each pin of the device under test 12 to the exclusive OR gate in sequence for 32 clock pulses in order to build a new test vector. Under these circumstances, the shift register 500 functions as the multiplexer 20 of FIG. 1. Each bit of the shift register 500 is also applied from the OUTPUT SO line to the read register 72 (FIG. 3). After eight bits have been shifted into the read register 72, these eight bits are shifted out in parallel to the data bus 30a of the programmer 30. The programmer 30 can thus read the bits on the device under test 12. This function is not used for the pseudo-random testing technique, but rather to verify the fuse pattern in the device under test 12, if desired.

Figure 10A:
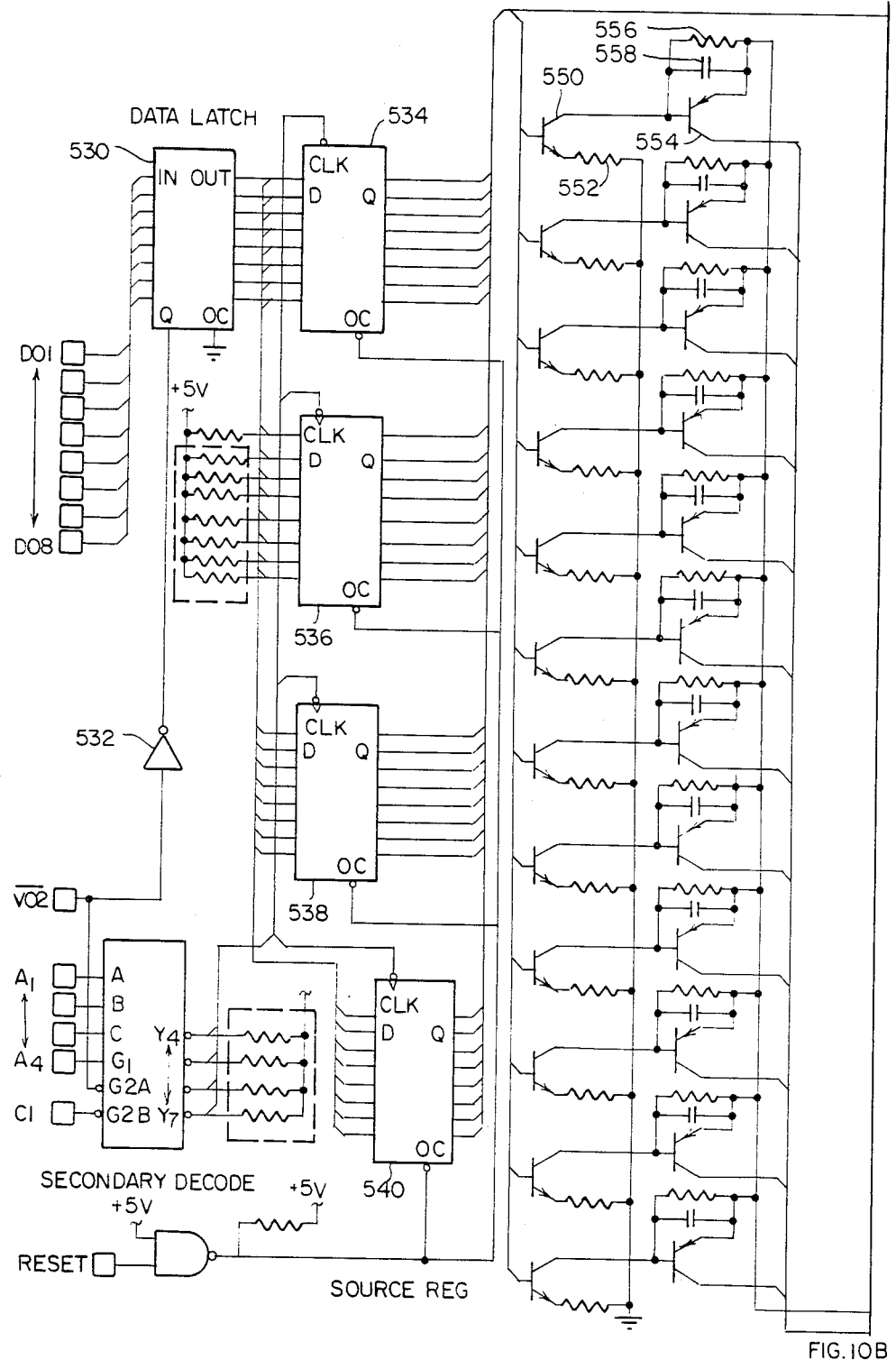
FIG. 10, comprised of FIGS. 10A and 10B, is a schematic of the pin driver subsystem of the functional testing system that applies logic levels to the device under test for programming the device.
Figure 10B:
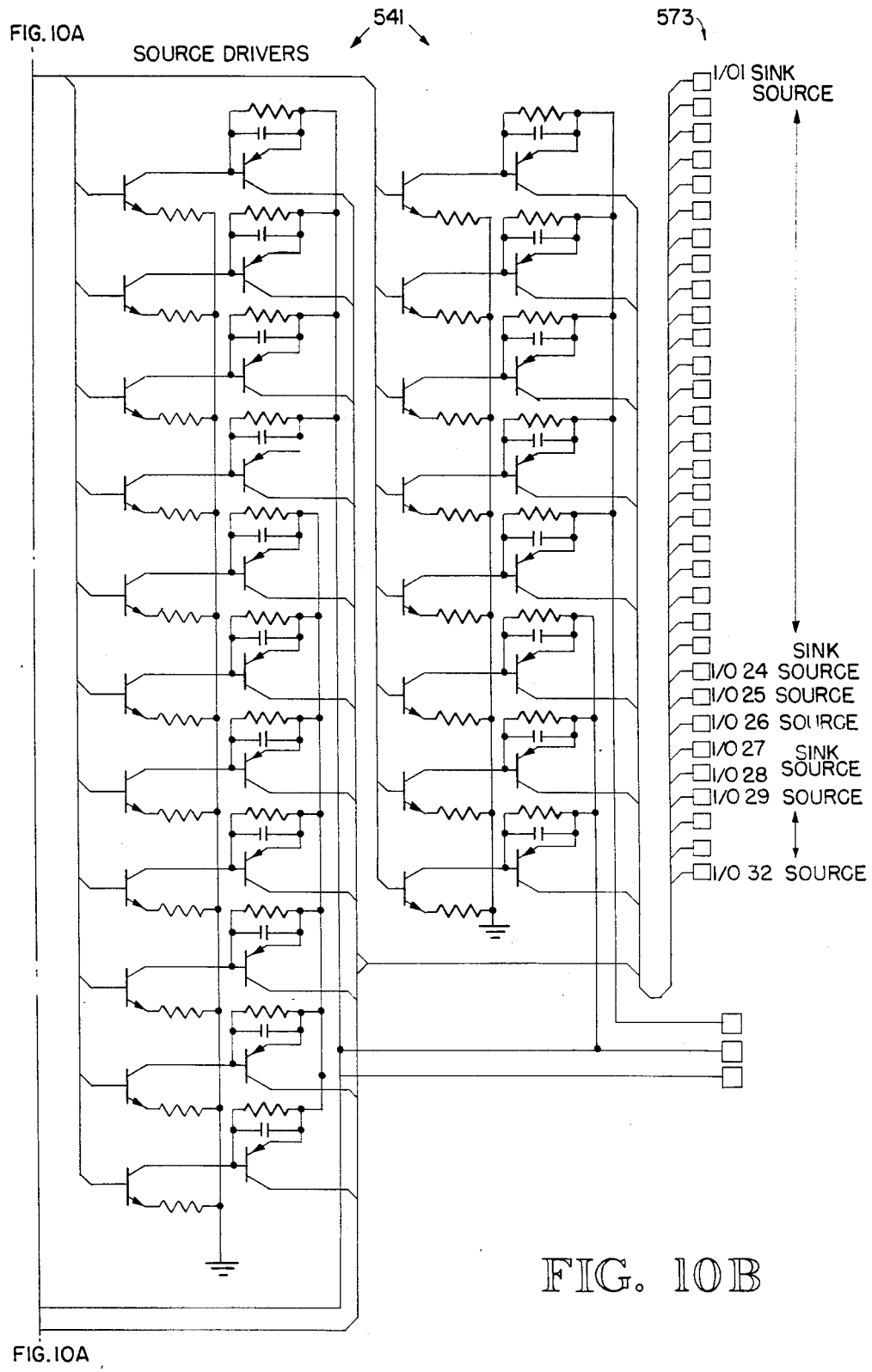

The system for testing programmable logic devices utilizing the inventive pseudo-random testing technique can also be used to program programmable logic devices. Accordingly, as illustrated in FIG. 10, programming data from the data bus 30a of the programmer 30 is clocked into a data latch 530 by the clock signal $\overline{V02}$ of the programmer 30 applied through an inverter 532. The output of the data latch 530 is applied in parallel to four data latches 534-540. Each of the data latches 534-540 is individually clocked by respective outputs of a secondary decoder 542. The secondary decoder 542 is enabled by the C1 bit from the decode latch 56 (FIG. 3) during one pulse of the clock signal $\overline{V02}$. The particular latch of the data latches 534-540 that is enabled is determined by the A1'-A3' outputs of the decode latch 56. The bits to be applied to the first eight pins of the device under test 12 are first recorded by the data latch 530 and then written into the data latch 534. The bits for each subsequent eight pins of the device under test 12 are then sequentially applied from the data bus 30a of the programmer 30 through the data latch 530 to each of the data latches 536-540 until the logic levels for all 32 pins are stored in the data latches 534-540.

Each output of the data latches 534-540 is applied to a respective driver circuit, indicated generally by reference numeral 541. Each of the driver circuits 541 consists of a switching transistor 550 having its emitters connected to ground through a resistor 552. The collector of the switching transistor 550 is connected to the base of a current source transistor 554 having its collector connected to a corresponding pin of the device under test 12. The emitter of the transistor 554 is connected directly to a supply voltage which is either the BIT SW #1, the BIT SW #2, or the CE SW signal from the waveform generator 34 (FIG. 7). A resistor 556 is connected between the emitter and base of transistor 554 to pull the base high when the switching transistor 550 is turned off. A capacitor 558 is connected in parallel with the resistor 556 to control the response time of the driver circuit 541. Thus, programming data for all 32 pins is stored in the data latches 534-540, and, when the BIT SW #1, BIT SW #2, and CE SW signals are switched on, current is selectively applied to all 32 pins of the device under test 12 to program the device. The data latches 534-540 are cleared by the RESET signal from the waveform generator 34 any time one of the current-sensing circuits senses that one of the current thresholds is exceeded or upon initial application of power, as explained above with reference to FIG. 7. The RESET signal to clear the data latches 534-540 is applied through a NAND gate 570 having its output biased high through a pull-up resistor 572.

Figure 11:
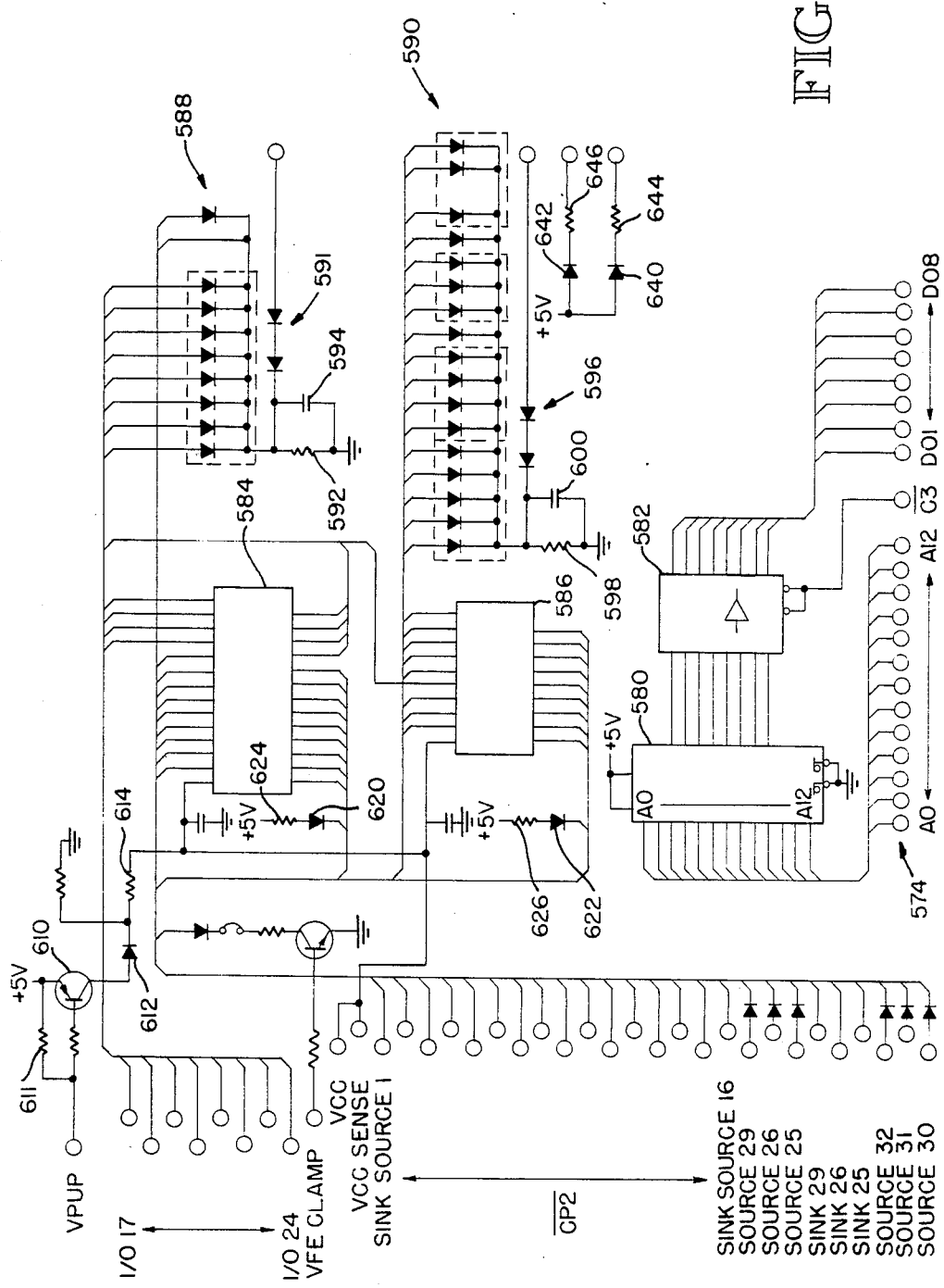
FIG. 11 is a schematic of a testing and programming adapter that interfaces the device under test to the remainder of the functional testing system in order to adapt the testing system to the specific type of logic device being tested.

The various types of programmable logic devices are programmed in various manners. Thus, the programming data that is appropriate for one type of programmable logic device will not be proper for another. In order to adapt the testing device 10 to the specific device that is being programmed, an adapter plugs into a receptacle connected to an I/O bus 573 and a CPU bus 574, as illustrated in FIG. 11. The device under test 12 then plugs into the adapter. The adapter is programmed for the particular type of programmable logic device that it receives. Accordingly, as illustrated in FIG. 11, a PROM 580 is programmed with data indicative of the characteristics of the particular programmable logic device which its adapter is designed to receive. The programmer 30 addresses the PROM 580 and the resulting data is clocked through a data latch 582 to the data bus 30a of the programmer 30. In this manner, the programmer 30 is able to adapt itself to the particular characteristics of the device being programmed. Thereafter, it stores appropriate data bits in the data latches 534-540 (FIG. 10) for programming the device. The object code stored in the PROM 580 for an adapted used with signetics IfL type programmable logic devices is as follows (stated in Motorola Exorciser Format, Code 82:

```
S0060000484452 1B
S1138CB30EB6DF D4DEA5EE0FE600089D8D66250B18
S1138CC30808085A26F48600C60039880 8EE0ADE1
S1138CD3009702D70339035C0 8CE69168 8D180BF9
S1138CE30A8D22CE8D32B8D44811B25118124251 8
```

```
S1138CF3038BBC398010CE8D04BD602CA6B08A4BF2
S1138D03392223202011E1F1C1D1A1B18191617140B
S1138D1315121310011CE8D38BD8D44CB2020CACE2D
S1138D238D3EBD8D4416C009535CCB2A863A390166
S1138D332E2E012020012424010A0A010A0A0101A
S1138D4301DFD6BD8D82DED4BD6023968797D89686
S1138D5388DED6BD8DA237BD8D8F96D8BD8DA23248
S1138D6397D93996D4A1002515260696D5A10125B0
S1138D7380D96D5A00197D596D4A20097D40C39DECD
S1138D83D6A6005F808EB004A26FA39DED6A60009
S1138D934C4C90D797876009D69786DE8639E60F
S1138DA300D7880BE600D7875FD786086D002706B3
S1138DB3A1002508A0005C7A00B826EF36DE86BD74
S1138DC36B2633D887390300DE8DD6000088DF3006D
S1138DD3948E02CE8DEDBD8D44812D25078B2D27E4
S1138DE306800139884039081C39014A4A013030E2
S1138DF3CE8DFCBD8D448689390101010808CE66
S1138E038E08CBD8D44CB3020D0014A4A01020202AC
S1138E13078008E2000068E2D0107808E20CE8E279A
S1138E23BD8D44390128280139300CE8E36BD8D44A2
S1138E33CB3039010808010101010129BE41CE8E8D
S1138E4348BD8D44390121210109097C00D996D9F2
S1138E53D6D3C1202516C12A240A812425148D17A0
S1138E63C12A250EBD8D2897D2D7D339812E250249
S1138E7380D95BD8CEC20F07C00D37F0BD996D9D628
S1138E83D3397D00D22A01397C00D996D9D03812E
S1138E934A2508DE2C1302680586005F20C9BD8D2E
S1138EA3DC20C47C00D996D9D6D3812825B38DC7B3
S1138EB320B57C00D996D9D6D3812125AA8DB82093
S1138EC3A6B606C08F9E014A8FA400228FAB00081A
S1138ED38FB2004BFB900048FC001363601202DFD
S1138EE3012121010A0A0122220101010108081C9
S1138EF3010101040401010101010148F19A9
S1138F038F198F198F4F8F578F5B8F5C8F5C8F6691
S1138F138F668F678F680FBE0DCB0A0908212DCB
S1138F2323222524272629282E2A2D2C2F2E07B6F6
S1138F33504030201004F5717273745D515253347
S1138F4354555657585950585C5D5E5F60616263162
S1138F53646566677F707A7B762E2F3031252623E1
S1138F6321242227D28292C2A3620210BEC
S1138F7301040101040CE8F6C96DC48BD602C7C0897
S1138F8D996D9A100264470800D97C00DB96DBA1C6
S1138F930126387F000B7C00DC20304FCE8EDD20C1
S1138FA3218601CE8EE3201A8602CE8EE920138613
S1138FB303CE8EEF200C8604CE8EF520058680SCED7
S1138FC38EFB97DCBD8D4497D9D7DB96DC4836CE30
S1138FD38F01BD602CEE0096D9BD602CA600097D2FC
S1138FE332CE8FDBD602CEE0096DB7D0DC2705B1
S10F8FF3BD602CA600097D396D2D6D339CB
S1138934860743940497E48624D815526B7B624A8
S1138944DE27028D0DB6240027028D0139CE80B479
S11389542003CE8D18DFDC8D17DEA5A602CE898416
S1138964811C2703CE89ABDF869788DEDCAD003910
S113897480B297863397E8B63397EA962097EE393D
S1138984100807060504030219181716150B141385
S113899412111A100F0E0DBC0B8BA098100504039B
S113899A0201B00D0C801AB0BAB90811BF1D07B110
S11389B496E28A0797E2CE240DF8AC608A6004815
S11389C436DE86A6002B0525168D8AFDDE8608DF65
S11389D486327A008270D5A26E5DE8AB820DABD15
S11389E48AF320E9CE8BB696984ABD602CA6B0F63E
S11389F4240043840C270158A603637C5B01270DF6
S1138A048AB0C97EB86A0D8B0CF69FF2C5B42603E
S1138A144A26F333325A26E2BD8AB38610BD601166
S1138A24BD8AD026058610BD60148604CE00D9776
S1138A3488DF86CE2409DF8ADE86E6B00DE8A8610B5
S1138A44BD601727DE10082730C674CE8C5B868DAC
S1138A54BD601727283F0BDCE6C9B0D1ACE8CA2961B
S1138A64A8810127BACE8CA681B227B3CE8CAB8D64
S1138A748D530EE003131A6002710080B6D03B20F6B9
S1138A843F13E7003FBB7A00B827DCDE860BDF86A5
S1138A94DE8AB8DF8A2B0A13937CE00D05F4A8108F4
S1138AA425D50B8DDB8DBB20F74C594A26FC173339B6D3
S1138AB41DBD600E97D0B620BD6D00E97D1B6308BD60
S1138AC4600E97D28640BBD60BE97D339CE240094FE9
```

```
S1138AD4C604AB085A26FA4D39CE00F05F4A812A
S1138AE49825060808800820F64C594A26FC39371C
S1138AF48DE853E400E7003339378DDEEA00E700FC
S1138B043339B959A9F9F9535BD6044CE0064BDC8
S1138B14603E323996E28A0797E2CE240FDF8A3F19
S1138B24BB801B72405B6240E36CE8BA28D2ECE79
S1138B348BBB8D29CE8BB28D24BD8C2BCE8BED8D2E
S1138B441CCE8BD98D17DE8A9688BD6B2CDF8AB63E
S1138B5424058B8119B72405324A26CD39DFDA8678
S1138B64018724068D2BDE8AA6008DF8ADEDAAD7F
S1138B7400DE8609DF8686B1BB24B619B72407A3C
S1138B84008826E2DED4DF86DED6DF88DCD8DF8AFC
S1138B9439DE86DFD4DE88DFD6DE8ADFD839813B59
S1138BA4271E8131272481482720814C271C814397
S1138BB4270E814B27143981432708F14B27013911
S1138BC4DE86A6002B03BD8AFD39DE86A6002B0380
S1138BD4BD8AF339815A26108DE6BD8C2B8D13255D
S1138BE4078DE78D8C2B8D3139814C27058148127AE
S1138BF42839DE86A6002B2EBD8A9CA40027C60E
S1138C0475CE8C70BD8A52B624D358D38CE8C948D35
S1138C148A7AB62406BD2DBD39DE86A6002B078D6F
S1138C248A9CA400279398650BD6B0E97D08660EB
S1138C34BD600E97D1867BD600E97D28680BD60EC
S1138C440E97D339364444448A38BD6B3B32845D
S1138C540F8A39BD603B392C2046494E4745525B5B
S1138C64524940E542046414940545400B2020535407
S1138C74525543545524520454553542046414972
S1138C844C454420415420564454344F5220230B1C
S1138C942050494E02300800A564343200400C4FD4
S1128CA45708484947480B4E4F4D494E414CB038
S1138D04557E8008CE8018DF8BCE8031DFC4CE8997
S1138D1434DF6939059601837960280489603800B0
S1138D24599604806A9605807B96B908C282125B7
S1138D34282E3607881C4100869986B8845809DC6
S1138D448EA68E1201291C4200849D844885E28FB5
S1138D549D8EB58E3C0DE11C41008238822582D964
S1138D648D9D8E85BDC907801C4108699866388BE
S1138D743A8D9D8EA68E180732142100812980F834
S1138D848198800D8E4E8CD9083C142100812980CB
S1138D94E78199880D08F788EC439862097D3865840
S1138DA497D2BD8109B2619D6AA378D793326115AC6
S1138DB426F7860480D601726077F80C3C6223F1334
S1138DC47C0D296D2816B27068176270820D38645
S1138DD47197D220CD865097D28632910D3271797A1
S1138DE4D320BF97DD8D0F8604BD601726B4C100218
S1138DF427A80C3997DD8DBCB3BD891786269E7EE66
S1138E04B68497E88648897EABD82B386FF4397F447
S1138F114438DB8868B4397F2430C394F4397F043C9
S1138F124439F7F243398D1D96F64384FD4397F643F2
S1138F134860194942700B3BD6B4796F6438A024397C5
S1138F144F6432B2EB1D8283BD890A96F2438A404386
S1138F15497F24396E28A0597E296F6438A10439788
S1138F164F64396FE8A1097FE96E28A0297E2BD89480
S1138F1740A3996FE84EF97FE96F6438A4EF4397F6B6
S1138F18438607439E4E297E296F24384BF4397F20B
S1138F1943BD827E8A01398D54BD82E5BD828396B6
S1138F1A4E28A0797E296988103272696F64384FD8C
S1138F1B44397F643867B0D600E3696F6438A0243AF
S1138F1C497F643BD827E807439E4E297E23284B1A4
S1138F1D43996F243847F4397F24386708D600E362A
S1138F1E496F2438A804397F24328D84F3996D2D6E5
S1138F1F403584456D7F053D6F253C401843797B1
S1138F204F2433908DE896F438501260B96F64384BB
S1138F214FE4397F643208996F6438A014397F643AF
S1138F2243936BD80F8860BD601727032339302CE50
S1138F234832ABD890F6E0096D28180261C5D2708295
S1138F244F3996F64384EF4397F6438D528D308BDF80
S1138F25489008A8D6B80497E8195BD814896F243844C
S1138F2647F4397F24386001949427038D604796F2B3
S1138F274438A804397F2437E8176860097EC39865D
S1138F2849197EC39865597EC39865997EC39865190
S1138F2997EC3996A80101275810227EC2005960D
S1138F2A4FE8488D97FE96F6438A4FD4397F6433996C8
S1138F2B4FE8488D97FE96F6438A024397F6433996A5
S1138F2C4E28A0697E296F6438A024397F64396FE89
```

```
S11382D48A497FE3996D2D6D34D2A445D27BC4F53
S11382E43996DD81B226B332324F398DF496F643F2
S11382F484EF4397F6438DA78D99BD89BA8DCB8D6C
S113830049EBD89BA8DA98D97BD89BA8670BD6BBEAC
S11383144336860643942972E2BD827E3284B13971
S11383248D82077E819D83E08338839483488 3C51B
S1138334835D8362BD83E82725CE84138D22BD6BDCB
S11383440824B139CEBBBBDF1EDFB6BD6BBBD8CEE
S11383 54B3CEBDE1DF95BD6B2986B8BD6B14BC39E8
S113836 4DF86C6B186BD9B92D991978 9D788C613A7
S11383748D94393FBBCEBDE8DF1EDFB6BD6BB68D47
S11383848CB3CEBE7CDF95BD6B2986B8BD6B11399F
S113839 4BEB626C58D4E2 6BBCE84BB8DC3BD6BB586
S113 83A47E8348CE84268DB8DE8E969BA4BB270F53
S11383B4BD92D926BA97A9BD6B1DBD6B1A26E92B8D
S11383C483CE84BB8D9ABD82D927BADE8E 969BA42A
S11383D4BB26B2BD39BD6B1A26EC2BE3BD8379BD65
S11383E46BB22BD9DE91DF88CEB1BDDF86DE88A655
S11383F4BB26B8B8DF88DE86B926FB39AAAAAAA74
S113840 4AA5A5555555555555555595AAAAABAAA71
S11 3841 4AAAAAAAFAFFFFFFF5755555555595FFFF77
S11 38424FF0FB0000000000000F0FFFFFFF030000000 0046
S1138434BBFFFFFFBFDE86A 6BBB6DF96DE88A7BBA4
S113844 4BBDF885A26EF3997DDBD8CB3BD8917866BA
S113 8454 2697EE86 8097E88 64B97EABD82B386FF1B
S11384644397F44396F6438AB14397F643BD8297BB
S1138474BD8566BD82E596E28AB597E2BD82A3864B
S11 3848 47BBD6BBE97D18 68BBD6BBE97DBBD82B357
S11 38494 86B54394E297E2BC39D6D396D2BD85433C
S113 84A4812B2763 84B12 6B5BD859B2B 3BD85B8FA
S11 384B496E28AB497E27DBB89261586 8497E8BDAE
S113 84C4828396FE8AB197FE96E28AB297E22BBD41
S11384D4BD8283968997FC96E28AB197E2BD82A3C2
S11384E486B194942 7B3BD6B47BD82B386B34394F5
S11384F4E297E286B44394E2 97E286B97E8BD8992
S113850 4BBBD85847E819596E28AB497E27DBB8984
S1138514 2615868497E8BD8 28396FE9AB197FE9683
S1138524E28AB297E22BD968997FCBD828396E243
S113 8534 8AB197E2BD89BA96FE8A4B97FE2BA136F5
S11 38544 44CEB9868DBBE17CEBB888DBBD8297BD5B
S11 38554 8566323 96FBB6FB14C BD69B169BB4A2642
S1138564F93986FF4397B434397F24397F897FA1B
S113 8574 96F6438AB4397F6439 6FE8A8097FE390B
S1138584 96F64384EF4397F6437E88F69687484 3EA
S113859 44397FB4397F89686434397F24397FA7DBB
S113 85A4BB872ACC96FE847F97FE96F64384EF4395
S11385B497F64 33986FF4397FB4 34 397F2439687EC
S11385C 44 84397F89686 4397FA7DBB872ACC87E35
S113 85D484 7FB7FE96F6438AB14397F64339BD82B7
S11385E4E596D2D6D3BD85438 12B27598 4B12 6B735
S11385F4BD859B29BB54F39BD85B8 96E28AB797E278
S113860 47DBB89262A8DBAD68 8D4DB26B14 39488ED
S11386 1 4 39BD82A3 86B8BD6BBE 36BD82B386B 7 43 BE
S11386244 94E297E2BD89 BBBD8584BD9 27E3 2 398D92
S11386 34BAD68 9D4B12 6B14 3948 9 39BD82A3867BBC
S11386 44BD6BBE 2BD4BD 8 5 6696E28AB797E27DBB5C
S11386 548 326B68DBC97DB2BB58DEB97D12BD9 36D4
S113 8 6 64 96E 48AB8 97E4 3297DDBD8CB3BD8917 86F6
S11386 7 4 2 697EE 8 624 97E8 8 624 97EA 96F 64 384EFB1
S11386 84 4 39 7F 64 3BD 82B 38 6FF4 3 9 7F4 4 3BD 82E 5 2 3
S11386 94BD88BF BC3 9D6D3 96D2C13B26B37E 873B1E
S113 86A 4812B242 6 36 8684 97E8 864 B 97EA 32BD87 5B
S11386B46A96E28AB497E2BD 87C486B34394E297E8
S11386C4E2BD 89BBBD88ED7E 819536864 97E8 86A8
S11386D 4 8 4 97EA 32BD 86 10 968 7 97FC 9 6E 28AB 19 7 BC
S11386E 4E286B44394E297E286B64394E497E4 968A
S11386F4F6438AB14397F64396FE8A9097FE96E2E1
S113870 4 8AB 4 97E296F64 38AB24 397F64 396E28AEA
S113 871 4B297E296FE8AB297FE86B19442 7B3BD8B
S113 8724 6B47BD82B396FE847F97FE96F64384EF3A
S113 8734 4397F6437E86BE36 86B54394E297E286E3
S113874 4BB97E8BD827E32CEBB86BD8558BD88EB2B
S113875 496E28AB4 97E2968797FC96E28AB197E266
S113 8 7 64BD6B4 77E86BE363744CEBB86BD8558BD7F
S113 877 4 8 2 9 7 3 3CACB53D7F4 5 3 3 2 8 5B12 6 3B9 6 8 6 8B
```

```
S11387844343397F24397FA96874343397FB4397F8B2
S113879485B126BA96F64384FE4397F64339 96F6F2
S11387A4438AB14397F64396FE8A2B97FE39BD888F
S11387B4EB96864397FA96874397F8B5B126DF392E
S11387C4B6B84394E497E496F6438A1B4397F64361
S11387D496FE8A1B97FE96E28AB297E2C6B3BD6B6B
S11387E44196F6438AB24397F64396FE8A4B97FEDF
S11387F486B19494278BD6B47BD82B396FE84EF3B
S11388B497FE96F64384EF4397F64339 8B2BCEBBCF
S113881486BD8558CACB53D7FB53C5B126BD96F6B4
S11388244394FE4397F643BD82833996F6438AB113
S11388344397F64 32BF13696F6438A1B4397F6435A
S11388443 2BD82E596D2D6D3C13B27618126244536
S1138854 36864B97EA32BD876A96E28AB497E29693
S11388 64F6438AB24397F64396FE8A4B97FE8DB5A3
S1138874 84 9B394F39867BBD6BBE36BD82B3 86B15B
S11388844394E297E2BD89BB8D5F86FF4397F443E6
S1138894BD827E3239BD881896E28AB597E2BD8294
S11388A4A3BDD2D687D4D126B143948739CEBB86AA
S11388B4BD8558BD88BF968794D139BD88EBBD82F3
S11388C48396E28AB597E2BD82A3867BBD6BBE97B3
S11388D4D1BD82B386B54394E297E23996F6438A7E
S11388E4B14397F64386FF2BBA96F64384FE439792
S11388F4F6434F4397FB434397F243394F97F8971E
S113 89B4FA97FC97FE39B1B1B1B1394A48BD6B2CEC
S11389 14EEBB3996E2C6BB84E7C41B1B97E2 96E2E7
S1138924C6BB843FC4CB1B97E296E48AB197E43935
S1B788BBBBBB8FFFEA
S9B3BBBBFC
```

The testing and programming adapter is provided with two separate receptacles 584,586 for the programmable logic device, both of which are connected to pins mating with the corresponding pins of the I/O bus 573. The pins of the device under test 12 are clamped to either the BIT SUPPLY voltage through diodes 588 or to the CE SUPPLY voltage through diodes 590 in order to prevent excessive voltages from being applied to the device. The BIT SUPPLY voltage is applied to the cathodes of the diodes 588 through a pair of voltage dropping diodes 591, and the resulting voltage is applied across a voltage spike clamp circuit comprising a resistor 592 and a filter capacitor 594 in parallel. Similarly, the CE SUPPLY voltage is applied to the cathodes of the diodes 590 through a pair of voltage dropping diodes 596, and the resulting voltage is applied across a voltage spike clamp circuit comprising a resistor 598 and a filter capacitor 600 in parallel.

In the absence of power supply voltage VCC, a VCC pull-up transistor 610 is turned on to apply voltage to the device under test 12, to which the power supply voltage VCC is connected. The voltage applied is current limited by a resistor 614. If the device under test 12 is mistakenly put in backwards, the voltage on the input of the device will be less than 0.7 volt; and this is sensed by the programmer 30 through a VCC SENSE output. The programmer 30 will then inhibit the digital-to-analog converter 210 (FIG. 7) from causing the power supply voltage VCC to be generated and applied to the device under test 12 since this might damage the device. A diode 612 is provided to prevent the power supply voltage VCC, when applied, from forward biasing the collector base junction of transistor 610. A resistor 611 holds the transistor 610 at cutoff when the VPUP input in floating.

The clock pins of the receptacles 584,586 are connected to a 5-volt power supply by respective diodes 620,622 through respective resistors 624,626 to provide fast rise times for the $\overline{CP1}$ and $\overline{CP2}$ signals. A pair of light-emitting diodes 640,642 mounted adjacent to each of the receptacles 584,586 is selectively illuminated by the programmer 30 by current flowing through respective resistors 644,646 to identify which of the receptacles 584,586 is being programmed.

The function performed by the testing system 10 for various addresses and words on the data bus of the programmer are as follows:

| ADDRESS      | LABEL  | FUNCTION                        |
|--------------|--------|---------------------------------|
| 6000 to 7FFF |        | Base Pak firmware               |
| 8000 to 9FEF |        | Test/Prog. Adapter firmware     |
| 00E0 or 00E1 | CTLREG | mode reg                        |
| 00E2 or 00E3 | RISCTR | sw. control reg (Trise, on/off) |
| 00E4 or 00E5 | SWCTR  | control reg (overcurrent range) |
| 00E6 or 00E7 | ROCCTR | reset mem                       |
| 00E8 or 00E9 | BITSW1, |                                |
|              | BITSW2 | BIT supply DAC                  |
| 00EA or 00EB | CESWC  | CE supply DAC                   |
| 00EC or 00ED | VCC    | VCC supply DAC                  |
| 00EE or 00EF | VREF   | comp. ref. DAC                  |
| 00F0 or 00F1 | SVREG1 | sink vector reg (I/O 1 to 8)    |
| 00F2 or 00F3 | SVREG2 | sink vector reg (I/O 9 to 16)   |
| 00F4 or 00F5 | SVREG3 | sink vector reg (I/O 17 to 24)  |
| 00F6 or 00F7 | SVREG4 | sink vector reg (I/O 25 to 32)  |
| 00F8 or 00F9 | SREG1  | source reg (I/O 1 to 8)         |
| 00FA or 00FB | SREG2  | source reg (I/O 9 to 16)        |
| 00FC or 00FD | SREG3  | source reg (I/O 17 to 24)       |
| 00FE or 00FF | SREG4  | source reg (I/O 25 to 32)       |
| 9FF0 to 9FF1 | SHFREG | read reg                        |
| 9FF2 or 9FF3 | STREG  | status gate                     |

| ADDRESS      | LABEL  | DATA | FUNCTION                              |
|--------------|--------|------|---------------------------------------|
| 00E0 or 00E1 | CTLREG |      | mode reg                              |
|              |        | 0F   | enable input regs for write operation (F0-F7) |
|              |        | 1F   | read input regs (F0, F1) I/O 1-8      |
|              |        | 2F   | read input regs (F3, F4) I/O 17-24    |
|              |        | 3F   | read input regs (F4, F5) I/O 17-24    |
|              |        | 4F   | read input regs (F6, F7) I/O 25-32    |
|              |        | 5F   | read output regs I/O 1-8              |
|              |        | 6F   | read output regs I/O 9-16             |
|              |        | 7F   | read output regs I/O 17-24            |

-continued

| | | | |
|---|---|---|---|
| | 8F | | read output regs I/O 25-32 |
| | 9F | | run fingerprint (no CE or CP) |
| | 9E | | run fingerprint (CP1 enabled) |
| | 9D | | run fingerprint (CP2 enabled) |
| | 9B | | run fingerprint (CE1 enabled) |
| | 97 | | run fingerprint (CE2 enabled) |
| | Note: | | bit 1 = CP1, '0' = enable<br>2 = CP2<br>3 = CE1<br>4 = CE2<br>All 16 combinations of CP and CE are legal. |
| 00E2 or 00E3 | RISCTR | | SW control reg |
| | BS1CMK | bit 0 | bit sw #1 on/off, '1'=on, '0'=off |
| | BS2CMK | bit 1 | bit sw #2 on/off |
| | CESCMK | bit 2 | CE sw on/off |
| | BR11MK | bit 3 | bit sw #1 Trise #1<br>'1'=0.4V/musec<br>'0'=20V/musec |
| | BR12MK | bit 4 | bit sw #1 Trise #2<br>'1'=1.5V/musec<br>'0'=20V/musec |
| | BR21MK,<br>BR22MK | bit 5 | bit sw #2 Trise #1<br>'1'=1.5V/musec<br>'0'=20V/musec |
| | CSR1MK | bit 6 | CE sw Trise #1<br>'1'=0.4V/musec<br>'0'=20V/musec |
| | CSR2MK | bit 7 | CE sw Trise #2<br>'1'=1.5V/musec<br>'0'=20V/musec |
| 00E5 or 00E5 | SWCTR | | Control reg |
| | VCCCMK | bit 0 | VCC current range 1=1A, 0=400mA |
| | CECCMK | bit 1 | CE current range 1=600mA, 0=300mA |
| | BSCCMK | bit 2 | Bit current range 1=600mA, 0=300mA |
| | VFCCMK | bit 3 | VFE clamp control 1=clamp on, 0=clamp off |
| | VPUCMK | bit 4 | VPUP (backwards test) control |
| | LED1 | bit 5 | SEL A 0=LED on, 1=LED off |
| | LED2 | bit 6 | SEL B |
| | STCMK | bit 7 | scope sync, ttl pulse |
| 00E6 or 00E7 | ROCCTR | | reset mem |
| | | 0XXXXXXX | set overcurrent |
| | OCCMSK | 1XXXXXXX | clear overcurrent (only bit 7 used) |
| 00E8 or 00E9 | BITSW1,<br>BITSW2 | | bit supply DAC |
| | | $00-$FF | 0V to 35 V full scale |
| 00EA or 00EB | CESWC | | CE supply DAC |
| | | $00-$FF | 0V to 35 V full scale |
| 00EC or 00ED | VCC | | VCC supply DAC |
| | | $00-$FF | 0V to 15 V full scale |
| 00EE or 00EF | VREF | | comparator ref DAC |
| | | $00-$FF | 0V to 10.24V full scale |
| 00F0 to 00F7 | SVREGx | | sink vector registers 1..4 |
| | | 0 | I/O=1 |
| | | 1 | I/O=0 |
| 00F8 to 00FF | SREGx | | source registers 1..4 |
| | | 0 | source off |
| | | 1 | source on |
| 9FF0 or 9FF1 | SHFREG | | read vector reg or output reg, depending on mode reg |
| 9FF2 or 9FF3 | STREG | | status gate |
| | SLFMSK | bit 0 | self test jumper, 0 = test enable |
| | PJOMSK | bit 1 | pulse reject option mask [0 = military, 1 = commercial] |
| | CROMSK | bit 2 | status, 1 = fingerprint ready to be read |
| | BS1MSK | bit 3 | bit sw #1 |
| | BS2MSK | bit 4 | bit sw #2 |
| | CELMSK | bit 5 | CE sw |
| | BKOMSK | bit 6 | VCC bit |
| | OVCMSK | bit 7 | overcurrent, 0 = overcurrent |

We claim:

1. A system for testing a logic device having a plurality of electrical contacts which serve as either inputs to or outputs from said logic device, said system comprising:

a first shift register having a plurality of stages each receiving a respective input and generating a respective output, all such stages except a first stage receiving an input from a previous stage and each of said stages except a last stage applying its output to a subsequent stage;

an isolation element connecting each of a plurality of electrical contacts of said logic device to the output of a corresponding stage of said shift register so that the logic level on each electrical contact serving as an input is controlled by the output of a corresponding shift register stage and the logic level on each electrical contact serving as an output is controlled by the output of said logic device, whereby said shift register applies a test vector to said logic device without the need to determine whether each electrical contact is serving as an input or an output;

an exclusive OR gate having an output applied to the input of the first stage of said shift register and a plurality of inputs receiving the outputs of a plurality of stages of said shift register and the signals on a plurality of the electrical contacts of said logic device;

timing and control circuit means connected to said shift register for controlling the operation of said shift register and allowing said logic device to respond to a plurality of said test vectors; and data output means providing an indication of the response of said logic device to a plurality of said test vectors.

2. The testing system of claim 1 further including a multiplexer having an output connected to one input of said exclusive OR gate and a plurality of inputs each connected to one of the electrical contacts of said logic device, said multiplexer being operated by said timing and control circuit means to sequentially apply individual inputs to its output in synchronization with the operation of said shift register thereby allowing a new test vector to be generated after said multiplexer inputs have been shifted into said shift register.

3. The testing system of claim 2 wherein said timing and control circuit means includes means communicating with said logic device for preventing said logic device from responding to the contents of said shift register while said multiplexer inputs are being applied to said exclusive OR gate and the outputs of said exclusive OR gate are being shifted into said shift register, and means for causing said logic device to respond to the contents of said shift register while preventing said shift register from shifting data from one stage to the next.

4. The testing system of claim 2 wherein said multiplexer includes an output shift register operated by said timing and control circuit, the response of said logic device to said test vector being transferred in parallel to respective stages of said output shift register and then being transferred in serial to said exclusive OR gate while the output of said exclusive OR gate is shifted into said first shift register.

5. The testing system of claim 4 wherein said timing and control circuit includes means for causing said logic device to respond to said test vector while preventing said first shift register from shifting data from one stage to the next, and means for preventing said logic device from responding to said test vector while the response of said logic device to said test vector is being transferred in serial to said exclusive OR gate and the output of said exclusive OR gate is being shifted into said first shift register thereby building a subsequent test vector.

6. The testing system of claim 1 further including a counter recording the number of responses of said logic device to said test vector and causing said timing and control circuit means to prevent further shifting of said shift register when the number of responses to said test vectors reaches a predetermined number.

7. The testing system of claim 6 further including output means for recording the test vector stored in said shift register when said logic device has responded to said predetermined number of test vectors.

8. The testing system of claim 7 wherein said output means includes a read shift register having an input connected to the output of the last stage of said first shift register, said read shift register receiving the final test vector from said first shift register in serial and then transferring the contents of said read shift register to the data bus of a processor in parallel.

9. The testing system of claim 1 further including means for controlling the logic level on predetermined electrical contacts of said logic device independently of the outputs of respective shift register stages connected thereto through said isolation elements.

10. The testing system of claim 1 further including a programmer controlling the operation of said system, said programmer including a processor having a data bus and address bus, and where timing and control circuit means further includes a decoder receiving inputs from said address bus and generating control outputs corresponding thereto to control the operation of said shift register.

11. The testing system of claim 1 further including a programmer controlling the operation of said system, said programmer including a processor having a data bus and an address bus, said testing system further including an adaptor that will be connected to other portions of said system and physically receiving said logic device, said adaptor including storage means containing data indicative of the device, said adaptor including storage means containing data indicative of the characteristics of specific logic devices which said adaptor is adapted to receive, said storage means applying said data to the data bus of said programmer as said storage means is addressed by the address bus of said programmer thereby adapting said programmer to the specific logic device being tested.

12. A method of testing a logic device having a plurality of electrical contacts, some of which serve as inputs and some of which serve as outputs, comprising:
 (a) applying an original test vector to the electrical contacts of said logic device through respective isolation elements so that the logic levels on contacts serving as outputs are determined by said logic device while the logic levels on contacts serving as inputs are determined by the components of said original test vectory, whereby said original test vector is applied to said logic device without the need to determine if each electrical contact is serving as an input or an output;
 (b) allowing said logic device to respond to said test vector;
 (c) creating a new test vector as a function of said logic device's response to the test vector being applied;
 (d) applying said new test vector to the electrical contacts of said logic device through respective isolation elements so that the logic levels on contacts serving as output are determined by said logic device while the logic levels on contacts serving as inputs ar determined by the components of said new test vector, whereby said new test vector is applied to said logic device without the need to determine if each electrical contact is serving as an input or as an output;
 (e) repeating steps (b), (c) and (d) a predetermined number of cycles; and
 (f) comparing the new test vector applied to said logic device during the final cycle to the test vector obtained from a logic device that is functioning properly.

13. The testing method of claim 12 wherein said logic device has a plurality of electrical contacts some of which output the logic device's response to said test vector and some of which input the test vector to said logic device, and wherein said new test vector is created by performing an exclusive OR function with the outputs of said logic device in response to at least some of the results obtained from such previously performed exclusive OR functions.

14. The testing method of claim 13 wherein said exclusive OR function is performed with the outputs of said logic device is sequence and said new test vector is created after said exclusive OR function has been performed with predetermined outputs of said logic device.

15. The testing method of claim 12 wherein the logic levels on said contacts are recorded and wherein said new test vector is created by performing an exclusive OR function with each recorded logic level in sequence and with predetermined bits from a multibit word that initially corresponds to the previous test vector, each bit of said word being sequentially shifted to the next bit as a result of each successive exclusive OR function being shifted into the first bit of said word whereby said word corresponds to said new test vector after said exclusive OR function has been performed with predetermined recorded logic levels.

* * * * *